United States Patent
Higashitani

(10) Patent No.: US 7,200,927 B2
(45) Date of Patent: Apr. 10, 2007

(54) METHOD FOR PRODUCING A WIRING TRANSFER SHEET

(75) Inventor: Hideki Higashitani, Kizu-cho (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 308 days.

(21) Appl. No.: 10/758,129

(22) Filed: Jan. 16, 2004

(65) Prior Publication Data

US 2004/0151883 A1    Aug. 5, 2004

Related U.S. Application Data

(62) Division of application No. 10/420,876, filed on Apr. 23, 2003, now Pat. No. 6,946,205.

(30) Foreign Application Priority Data

Apr. 25, 2002    (JP) .............................. 2002-124407

(51) Int. Cl.
*H05K 3/02*    (2006.01)
(52) U.S. Cl. ............................ 29/847; 29/830; 29/846; 29/851; 156/235; 361/748; 428/612
(58) Field of Classification Search .................. 29/825, 29/830, 831, 746, 847, 851; 156/230, 235; 174/255, 260; 361/748, 751; 428/209, 210, 428/609, 612, 615

See application file for complete search history.

(56) References Cited

U.S. PATENT DOCUMENTS

| | | | |
|---|---|---|---|
| 3,884,771 A | 5/1975 | Hanabusa et al. | |
| 4,354,895 A | 10/1982 | Ellis | |
| 4,649,070 A | 3/1987 | Kondo et al. | 428/209 |
| 4,867,839 A | 9/1989 | Sato et al. | |
| 4,893,404 A * | 1/1990 | Shirahata et al. | 29/852 |
| 5,021,296 A * | 6/1991 | Suzuki et al. | 428/409 |
| 5,114,543 A | 5/1992 | Kajiwara et al. | 205/152 |
| 5,250,363 A | 10/1993 | Chen | |
| 5,252,383 A | 10/1993 | Fukutake et al. | 428/209 |
| 5,346,750 A | 9/1994 | Hatakeyama et al. | |
| 5,635,301 A | 6/1997 | Kondo et al. | 428/426 |
| 5,725,706 A | 3/1998 | Thoma et al. | 156/150 |

(Continued)

FOREIGN PATENT DOCUMENTS

JP    2-113589    4/1990

(Continued)

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

A wiring transfer sheet including a carrier base and a wiring layer formed thereon is produced so that an exposed area of a surface of the carrier base on which the wiring layer is formed has a plurality of concavities. By transferring the wiring layer to an electrically insulating substrate with this wiring transfer sheet, convexities which are complementary to the concavities are formed on the electrically insulating substrate. The convexities improve adhesion between a wiring board and a resin stacked thereon. Therefore, the wiring board thus obtained has surface coplanarity suitable for mounting a semiconductor bare chip and an electronic component as a whole, and a microscopical surface structure which adheres to a material stacked thereon.

6 Claims, 14 Drawing Sheets

U.S. PATENT DOCUMENTS

| | | | |
|---|---|---|---|
| 6,014,929 A | 1/2000 | Teng | 101/456 |
| 6,195,882 B1 | 3/2001 | Tsukamoto et al. | |
| 6,197,407 B1 | 3/2001 | Andou et al. | |
| 6,212,769 B1 * | 4/2001 | Boyko et al. | 29/852 |
| 6,346,335 B1 | 2/2002 | Chen et al. | |
| 6,359,235 B1 | 3/2002 | Hayashi | |
| 6,406,777 B1 | 6/2002 | Boss et al. | 428/209 |
| 6,429,114 B1 | 8/2002 | Hayama et al. | 438/616 |

FOREIGN PATENT DOCUMENTS

| | | |
|---|---|---|
| JP | 3-283696 | 12/1991 |
| JP | 6-268345 | 9/1994 |
| JP | 2000-77800 | 3/2000 |
| JP | 2000-77850 | 3/2000 |
| JP | 2000-154354 | 6/2000 |
| JP | 3172711 | 3/2001 |

\* cited by examiner

METHOD FOR PRODUCING A WIRING TRANSFER SHEET

This application is a Divisional application of Ser. No. 10/420,876 filed Apr. 23, 2003 now U.S. Pat. No. 6,946,205.

CROSS-REFERENCE TO RELATED APPLICATIONS

The present application claims a priority under 35 U.S.C. §119 to Japanese Patent Application No. 2002-124407 filed on Apr. 25, 2002, entitled "Wiring transfer sheet and method for producing the same, and wiring board and method for producing the same". The contents of that application are incorporated herein by the reference thereto in their entirety.

FIELD OF THE INVENTION

The present invention relates to a wiring transfer sheet which is used for forming a wiring of a wiring board and to a method for producing the same, and further relates to a wiring board which is produced by using the wiring transfer sheet and a method for the wiring board by using the wiring transfer sheet.

BACKGROUND OF THE INVENTION

Recently, a multilayer wiring board on which semiconductor chips such as an LSI and so on can be mounted at a high density has been used not only in the filed of industrial apparatus, but also in the field of household electric appliances, as a result of miniaturization and improvement in performance of electronics devices. For this reason, a cheaper multilayer wiring board is required. Further, the market always requires a multilayer board wherein a plurality of wiring pattern layers with a finer wiring pitch are electrically connected with a higher interconnection reliability.

In order to meet the requirement, a multilayer board wherein an inner via hole connection method is employed for interlay connection instead of a through-hole plating which was mainly employed, has been developed and practically used. According to the inner via hole connection method, interlayer connection between any electrodes of the multilayer print-wiring board can be obtained at any position of a wiring pattern. This multilayer board is called an All Layers Interstitial Via Hole (IVH) structure resin multilayer wiring board (see Japanese Patent Kokai (Laid-Open) Publication No. 6-268345). By employing this multilayer wiring board, it is possible to make a connection only between the desired wiring layers by filling the via hole with a conductive substance. Further, in this multilayer wiring board, it is possible to realize miniaturization of the board size and high density mounting since the inner via hole can be formed just under a component land.

In order to realize an interlayer connection with a higher density, there has been proposed a wiring board wherein two wiring layers formed on both surfaces of an electrically insulating substrate are electrically connected with a conductive paste which is filled in inner via holes, and at least one wiring layer is embedded in an adhesive layer. In addition, a method for producing the wiring board has been proposed, in which the wiring layer is embedded in the adhesive layer by transferring the wiring layer formed on a support base (see Japanese Patent Kokai (Laid-Open) Publication No.2000-77800). By employing this constitution, a high reliability is obtained even if the size of the inner via hole is small. Further, there has been proposed a transfer medium with a fine wiring pattern which is suitable for producing a high-density multilayer wiring board (see Japanese Patent Publication No. 3172711). A wiring transfer sheet which is suitable for forming a wiring layer is also disclosed in Japanese Patent Kokai (Laid-Open) Publication No.2000-154354.

The technique of forming the wiring layer with the wiring transfer sheet has been employed in the production of the wiring board as a useful method for forming the wiring. In the following, an example of the method for forming a wiring layer with a wiring transfer sheet is described referring to FIG. 16.

FIGS. 16(a) to (c) shows cross-sectional views illustrating the main steps in a method of forming a wiring layer. FIG. 16(a) shows a state in which wiring transfer sheets 1203 are superposed on both surfaces of an electrically insulating substrate 1204. FIG. 16(b) shows a step of transferring wiring layers 1202 of the wiring transfer sheets 1203 to the electrically insulating substrate 1204. FIG. 16(c) shows a step of removing support bases 1201 so as to obtain a wiring board.

In FIG. 16(a), the wiring transfer sheet 1203 is constituted by the support base 1201 and the wiring layer 1202 which is formed on the support base in a predetermined pattern. The wiring transfer sheet 1203 is produced by laminating a copper foil on an aluminum foil to obtain a composite foil followed by etching the copper foil selectively in a desired pattern, as described in Japanese Patent Publication No. 3172711. An enlarged view of Area A in the vicinity of the wiring layer of this wiring transfer sheet 1203 is shown in FIG. 16(d). As shown in FIG. 16(d), in the wiring transfer sheet, an exposed area of a surface of the support base 1201 (i.e. a surface which contacts the electrically insulating substrate) is flat. This is because the aluminum foil has a flat surface.

In FIG. 16(a), the electrically insulating substrate 1204 (to which the wiring layer is to be transferred) has through holes 1205 which are filled with a conductive paste 1206. A porous substrate which can be compressed, or a three-layer substrate wherein a core film is sandwiched with adhesive layers is used as the electrically insulating substrate 1204. The through holes 1205 are formed by laser processing using a carbon dioxide laser, an excimer laser or a YAG laser. The laser processing is generally employed for forming through holes since it is excellent in productivity.

Next, as shown in FIG. 16(b), the wiring transfer sheet 1203 is adhered to the electrically insulating substrate 1204 by heating and pressurizing, and then the wiring layer 1202 is transferred to and embedded in the electrically insulating substrate 1204. The electrically insulating substrate 1204 contains a thermosetting resin which is cured upon heating and pressurization so as to adhere to the wiring layer. Further, the conductive paste 1206 filled in the through holes 1205 is compressed by embedding the wiring layer 1202. Compression of the conductive paste 1206 makes the density of the conductive particles in the conductive paste high. Thus, the electrical connection between the wiring layers 1202 is ensured.

Next, the support base 1201 is dissolved and removed by etching whereby a wiring board which has wiring layers on both surfaces is obtained as shown in FIG. 16(c). Etching is conducted using as an etchant chemicals which selectively dissolve only the support base 1201 and do not dissolve the wiring 1202. FIGS. 16(e) and (f) show enlarged views of Areas B and C shown in FIG. 16(c), respectively. As shown in FIG. 16(e), an exposed area of a surface of the electrically insulating substrate 1204 becomes flat as a result of transferring the surface shape of the support base 1201. As shown in FIG. 16(*f*), the surface of the wiring layer 1202 also becomes flat. This is because the face which corresponds to the surface of the wiring layer 1202 reflects the surface shape of the support base 1201 which the wiring layer 1202 has contacted before transferring. A semiconductor bare chip is advantageously mounted on the wiring board having such a flat surface, and thereby an excellent initial mounting characteristic is ensured.

As the flatness of the surface of the wiring board increases, the initial mounting characteristic becomes better, while the adhesiveness of the wiring board to a substance (e.g. a resin) which is laminated on its surface disadvantageously becomes lower. The substances to be laminated on the surface of the wiring board are, for example, a sealing resin which is used upon mounting a semiconductor bare chip, and a solder resist for protecting a solder which is used upon mounting an electrical component. In a case where the adhesion between these materials and the surface of the wiring board is bad, interfacial exfoliation tends to occur due to stress caused by heating or bending. Similarly, when a multilayer wiring board is obtained by laminating another electrically insulating substrate on the double-faced wiring board produced according to the steps shown in FIG. 16, the high flatness of the wiring board lowers the adhesiveness of the electrically insulating substrate to the wiring board, which tends to cause interfacial exfoliation between the electrically insulating substrates and interfacial exfoliation between the insulating substrate and the wiring layer (the copper foil) of the wiring board. In any case, the occurrence of the interfacial exfoliation causes mounting failure or contact failure, so that the property of a product in which the wiring board is incorporated is adversely affected.

As described above, the wiring board obtained by using the conventional wiring transfer sheet has excellent surface flatness, although there is a problem in that it is difficult to ensure the adhesiveness of the wiring board to the resin laminated thereon due to the high surface flatness. The present invention has been made in consideration of these circumstances, and an object thereof is to provide a wiring transfer sheet that enables production of a wiring board which has a surface flatness macroscopically suitable for mounting a semiconductor bare chip or a electronic component thereon, but which also has a surface structure to which a resin to be laminated thereon microscopically adheres well. Further, an object of the present invention is to provide a wiring board which is produced by using the wiring transfer sheet, wherein at least an exposed area of a surface of an electrically insulating substrate has a surface flatness macroscopically suitable for mounting a semiconductor bare chip thereon, while it also has a surface structure to which a resin to be laminated thereon microscopically adheres well.

SUMMARY OF THE INVENTION

In order to achieve the object, the present invention provides a wiring transfer sheet including a carrier base and a wiring layer formed on the carrier base, wherein, at least an exposed area of a surface of the carrier base on which the wiring layer is formed is a rough surface which is for forming another rough surface complementary to the former rough surface on an object to which the wiring layer is to be transferred. This wiring transfer sheet is for obtaining a wiring board by transferring the wiring layer to an electrically insulating substrate. Therefore, the object to which the wiring layer is to be transferred (which is merely referred to as an "object") is an electrical substrate for a wiring board.

By using this wiring transfer sheet, at the same time when the wiring layer is transferred to the electrically insulating substrate to form a surface of a wiring board which has the wiring layer, at least an area of the surface on which area no wire (i.e. no wiring material) lies, can be made a rough surface. When the surface of the wiring board is made a rough surface, the contact surface area of the wiring board (that is, the surface area which contacts a resin to be laminated thereon) is increased, so that the adhesiveness of the resin to the wiring board is improved. Therefore, the wiring board produced using the wiring transfer sheet of the present invention adheres well to the resin to be applied thereto.

In a wiring transfer sheet of the present invention, a "carrier base" is a sheet-like member which holds a wiring layer until the wiring layer is transferred to an electrically insulating substrate. In the wiring transfer sheet, the "wiring layer" is made of a conductive material, and is patterned so that a predetermined wiring pattern is formed in a wiring board.

The wiring layer is formed on one of the main surfaces of the carrier base (that is, one of the two large surfaces of the sheet). In this specification including the following description, a main surface of the carrier base is merely referred to as a "surface", and the main surface of the carrier base on which the wiring layer is formed is referred to as a "surface of a carrier base on which a wiring layer is formed." With respect to other sheet-like members, the main surfaces are merely referred to as a "surface."

The wiring transfer sheet is characterized in that at least an exposed area of a surface of the carrier base on which the wiring layer is formed is a rough surface. Here, the term "at least" is used in the sense that it includes an embodiment wherein only the area where the carrier base is exposed is a rough surface, and an embodiment wherein the entire surface of the carrier base (including an interface between the carrier base and the wiring layer) is a rough surface. The "rough surface" means a surface which has concavities and convexities. The concavities and convexities which constitute the rough surface include a variety of embodiments. The shape of each convexity or each concavity may be any one of a pointed shape (a conical shape or a pyramid shape), a column shape, a wrinkle shape, a ribbed shape, a bump shape, and a mushroom shape. Further, the rough surface includes an embodiment which only has concavities formed on a substantially flat surface, and an embodiment which has only convexities formed on a substantially flat surface. When transferring the wiring layer, the rough surface which is the exposed area of the surface of the carrier base closely contacts the object, and then a material of the object flows or softens to deform, which results in formation of another rough surface complementary to this rough surface of the carrier base on the object.

In the present invention, it suffices that the shape of the rough surface which is formed on the object is substantially complementary to the area where the surface of the carrier base of the wiring transfer sheet is exposed, and strict correlation is not required. For example, when the fluidity of the resin contained in the electrically insulating substrate that is the object is small so that the resin does not completely reach a bottom surface of a concavity, a convexity which has a height somewhat smaller than the depth of the concavity may be formed. When a wiring transfer sheet is made by laminating a copper foil having a rough surface on a resin sheet with the rough surface closely contacting the resin sheet to roughen a surface of the resin sheet followed by etching the copper foil, a wiring material (i.e. copper) may be left in concavities on an area where the surface of the resin sheet is exposed. In the case where such a wiring transfer sheet is used, convexities formed on an object have a height smaller than the depth of the concavities by the thickness of copper left in the concavities. Such convexities are regarded as being complementary to the concavities on the wiring transfer sheet. It should be noted that it is important in the present invention that the exposed surface of the electrically insulating substrate of the wiring board is roughened through transferring.

As described above, the feature of the wiring transfer sheet of the present invention is that it serves to roughen the surface of the electrically insulating substrate. Further, the inventors have found that, as to the wiring transfer sheet of the present invention, in a case where the conductive material is left on the area between wires where the surface of the carrier base is exposed (specifically in the concavities) after a desired wiring pattern has been formed by etching, the conductive material is not transferred to the electrically insulating substrate. This is also the feature of the wiring sheet of the present invention. When a wiring board is produced by bonding a roughened copper foil to a surface of an electrically insulating substrate followed by etching the copper foil so as to form the wiring layer, copper often remains on an unnecessary area after etching. Particularly, when a wiring pattern is fine, such remaining copper becomes more marked, and causes a short circuit. In order to prevent such a problem, overetching is often carried out. Overetching makes a wiring layer under a resist narrow, which may cause delamination of the resist. The delamination of the resist may hinder formation of necessary wiring, resulting in a failure to form a desired wiring pattern. For this reason, it is necessary to carefully control overetching when the wiring layer is formed on the surface of the electrically insulating substrate by etching. On the other hand, the above-mentioned feature of the wiring transfer sheet of the present invention makes it possible to easily form a wiring layer having a fine wiring pattern on an electrically insulating substrate without leaving a conductive material between wires unnecessarily.

The wiring sheet of the present invention is preferably one wherein the exposed area of the surface of the carrier base has a plurality of concavities for forming convexities that are substantially complementary to the concavities on the object. Herein, the term "concavity" is used to mean a portion which is apparently recessed from other portions and a recess which is formed on a substantially flat surface. The "portion which is apparently recessed from other portions" is, for example, a particularly deep hollow which exists on the surface having irregularities. Such a portion includes a portion which is shown as a dark portion on a photomicrograph with a magnification of about 1,000. On the other hand, the term "convexity" is used to mean a portion which apparently protrudes from other portions, and a protrusion which is formed on a substantially flat surface. The "portion which apparently protrudes from other portions" is, for example, a particularly high protrusion which exist on the surface having irregularities. Such a portion includes a portion which is observed as a protrusion on a photomicrograph with a magnification of about 1,000.

The surface having a plurality of concavities is obtained by subjecting a substantially flat surface to a) embossing using a male die embossing die having a plurality of convexities, b) a sandblast processing so that a part of the surface is scraped away, or c) electrolytic etching or dry etching. The male die having a plurality of convexities includes a metal foil on which particles are deposited through electrolytic plating, and an embossing roll.

Upon transferring a wiring layer to an object, the area having such concavities contacts the object, and then a material constituting the object flows into the concavities. Thereafter, the base material is peeled off. As a result, convexities which are substantially complementary to the concavities are formed on the surface of the object. The convexities formed on the surface give an anchoring effect by being easily embedded into a resin which is stacked on them. To the contrary, in the case where a resin is stacked on a surface having concavities, it is necessary to lower the melt viscosity of the resin, or to apply a large pressure upon stacking the resin so that the resin can flow into the concavities. That is, the structure of the surface having convexities adheres better to the resin stacked on it than does the surface having concavities. For this reason, the exposed area of the surface of the carrier base is preferably a rough surface having a plurality of concavities so that they can form a surface structure having convexities on the object.

Further, the wiring transfer sheet of the present invention is preferably one in which the entire surface of the carrier base on which the wiring layer is formed has a plurality of concavities, and the wiring layer enters the concavities. When the wiring layer of such a wiring transfer sheet is transferred to a surface of an electrically insulating substrate, the interface between the wiring layer and the carrier base is exposed. As a result, the surface of the transferred wiring layer also has convexities which are complementary to the concavities. In a wiring board, the proportion of the wiring layer on a surface depends on the kind of wiring board. For example, in a wiring board, an exposed area of a surface of the wiring layer is larger than an exposed area of a surface of the electrically insulating substrate. When a resin is stacked on the surface of such a wiring board, the area where the stacked resin contacts the wiring layer may be larger than the area where the stacked resin contacts the electrically insulating substrate. In this wiring board, the convexities which exist on the surface of the wiring layer are convenient for ensuring better adhesiveness to the resin. Further, the wiring transfer sheet in which the wiring layer enters the concavities formed on the carrier base ensures better adhesion therebetween since they engage each other. Therefore, as to the wiring board of this structure, it is generally unnecessary to combine the carrier base with the wiring layer using an adhesive agent.

The concavities on the surface of the carrier base occupy 50 to 98% of at least the exposed area of the surface. If the proportion of the concavities on the carrier base is small, the proportion of the convexities on the object is also small, and therefore the above-mentioned effect is not obtained.

Each concavity on the surface of the carrier base preferably has a diameter in the range of 0.5 to 5 µm. Herein, a "diameter" corresponds to the length of the longest line of lines each of which connects two arbitrary points on the concavity contour on the surface of the carrier base. The concavity contour on the surface of the carrier base corresponds to the contour of the concavity viewed from top. The concavities whose diameters are in the above range may be a part of or all of the concavities which exist on the surface of the carrier base. Therefore, some of the concavities may have a larger diameter than the upper limit of the above-mentioned preferable range. A concavity with a larger diameter is viewed, for example, as a type of concavity in which some concavities range. A part of or all of the convexities formed by such concavities each have a diameter in the range of 0.5 to 5 μm at its basis. Here, a "basis" means a plane on which the bottom ends (i.e. starting points) of the convexity exist. In the case where the bottom ends of a convexity are not on a plane which is parallel to a surface of an object, its basis is an area which is defined by crossing a plane parallel to a surface of the object on which the lowest bottom end passes, and its trajectory (i.e. vertical lines) is obtained by shifting other bottom ends in a vertical direction (i.e. the thickness direction) toward the surface of the object. Here, a "plane parallel to a surface of an object" means a plane parallel to a flat surface obtained by leveling the concavities and convexities which exist on the surface of the object (an electrically insulating substrate), and it is a vertical plane (perpendicular) with respect to a thickness direction of the electrically insulating substrate.

The concavity preferably has a depth in a range of 0.5 to 5 μm. The convexity formed by such a concavity has a height in a range of 0.5 to 5 μm. The height of the convexity is the shortest distance between the basis and the top of the concavity.

The diameter Su of a concavity on the surface of the carrier base and the depth D of the concavity are schematically shown in FIGS. 14(a) and (b). Su can be regarded as a diameter of the front of the concavity. In the concavity shown in FIG. 14(a), the areas of the sections which are vertical to the depth direction are not uniform. The top end of the illustrated concavity is on a plane which is parallel to the surface of the carrier base. The depth of a concavity whose top end is not on a plane which is parallel to the surface of the carrier base is a distance between the bottom of the concavity and a plane which is parallel to the surface of the carrier base and on which the highest top end (that is, the uppermost top end) passes. A "surface which is parallel to a surface of a carrier base" means a plane parallel to a flat surface obtained by leveling the concavities and convexities which exist on the surface of the carrier base, and it is a vertical plane (i.e. perpendicular) with respect to a thickness direction of the carrier base. A convexity which is formed by the concavity shown in FIGS. 14(a) and (b) is shown in FIG. 14(c). As shown in FIG. 14(c), this convexity has a shape which is complementary to the concavity. The basis of this convexity corresponds to the dotted line identified by "R", and its shape and diameter is the same as those shown in FIG. 14(b). Further, the height of the convexity (i.e. the shortest distance between the basis R and the top T) is equal to the depth D.

The concavity preferably has a shape of which sections vertical to the depth direction of the concavity are not uniform, and of which one of such sections having a maximum area exists at an intermediate position between the surface of the carrier base and the bottom of the concavity. Examples of such a concavity are shown in FIGS. 15(a) to (c). Each concavity shown in FIG. 15 (that is, a space surrounded by the carrier base) has an expanded portion between the bottom B and the surface of the carrier base, and the maximum sectional area is at the point m where the concavity expands most. The shape of each concavity (i.e. the shape of space surrounded by the carrier base) is a bud-shape (FIG. 15(a)), a bump-shape (FIG. 15(b)), or a mushroom-shape (FIG. 15(c)). These concavities can form convexities which expand at the waist, such as a bud-shaped, a bump-shaped or a mushroom-shaped convexity. In other words, each of these concavities can form a convexity in which a section vertical (perpendicular) to a height direction of the convexity (or a thickness direction of a wiring board) is largest at a position between the basis and the top. Such a convexity gives a larger anchoring effect, and therefore the wiring board having such a convexity on its surface adheres more favorably to a resin stacked thereon. Such a convexity can be regarded as one having "undercut" in the field of resin molding, and the undercut contributes to a higher anchoring effect.

In the concavity as shown in FIG. 15, of the sections which are perpendicular to the depth direction of the concavity, the section having the maximum area preferably has a diameter in the range of 1 to 10 μm. In FIG. 15, the diameter of the section having the maximum area (that is, the diameter at the most expanded point m) is shown by Smax. In the convexities formed by these concavities, a diameter of the section having the maximum area (that is, the section at the most expanded point) is in the range of 1 to 10 μm.

The wiring transfer sheet of the present invention is identified as a wiring transfer sheet including a carrier base and a wiring layer formed thereon. At least an exposed area of a surface of the carrier base on which the wiring layer is formed has a surface shape that is formed by pressing a metal foil having a plurality of convexities formed by electrolytic plating against the surface of the carrier base while the convexities contact the surface of the carrier base, followed by removing the metal foil. Such a surface shape is used for forming another surface shape complementary to the former surface shape on a surface of an object to which the wiring layer is to be transferred. In such a wiring transfer sheet, the exposed area of the surface of the carrier base has a surface shape which results from the convexities formed on the surface of the metal foil, and therefore, such a wiring transfer sheet gives the same effect as that of the above-mentioned wiring transfer sheet. The exposed area of the surface of the carrier base is a rough surface, and more specifically a rough surface having a plurality of concavities as described above. The convexities formed on the object by the use of this wiring transfer sheet are substantially the same as the convexities on the surface of the metal foil, since the concavities are complementary to the convexities on the surface of the metal foil.

The convexities formed on the surface of the metal foil by electrolytic plating generally have a bump-shape or a cloud-shape which is formed of fine particles (for example, round particles with a diameter of 0.1 μm to 4 μm) which are deposited so that they are flocculated and/or piled up. The shape and size of the convexity depend on the condition of electrolytic plating. Therefore, it is preferable that the convexities on the surface of the metal foil are formed by electrolytic plating under a condition appropriately selected so that desired concavities can be formed on the exposed area of the surface of the carrier base depending on the shape of the convexities to be formed on the object.

The wiring transfer sheet of the present invention is also identified as a wiring transfer sheet including a carrier base and a wiring layer formed thereon, wherein the wiring layer is to be transferred to an object. The exposed area of a surface of the carrier base is for making an average of ten point heights of irregularities Rz in the range of 2 to 12 μm within an area of the object, which area contacts the exposed area. Such a wiring transfer sheet makes the surface of the wiring board entirely flat, while making it a surface having concavities and convexities microscopically. The wiring board having such a surface has an excellent initial mounting characteristic, and adheres well to a material stacked thereon.

The carrier base of the wiring transfer sheet is preferably made from a material which is not compatible with a material of an object, that is, an electrically insulating substrate for a wiring board. The carrier base of such a material is easily removed from the electrically insulating substrate after the wiring layer has been transferred. The material for the carrier base is selected depending on the kind of the object (that is, the material of the electrically insulating substrate). When the electrically insulating substrate is, for example, one containing an epoxy resin, the carrier base is preferably made of a fluorine-containing resin. Since the fluorine-containing resin exhibits an excellent release-ability as to the electrically insulating substrate and has an excellent heat resistance, it does not decompose by heating and pressurization and is not compatible with the electrically insulating substrate. Therefore, the wiring transfer sheet having the carrier base made of the fluorine-containing resin makes it possible to roughen a surface of the electrically insulating substrate with ease. Particularly, when the carrier base has fine concavities on the exposed area of the surface, such a wiring transfer sheet makes it possible to form fine convexities on a surface of the electrically insulating substrate with ease.

In the wiring transfer sheet of the present invention, the carrier base may be a laminate which is composed of a plurality of layers wherein a surface on which the wiring layer is to be formed is a surface of a layer made from a material which is not compatible with the electrically insulating substrate. In the case where the carrier base is made of a combination of a plurality of layers whose material are different from each other, the release-ability of the carrier base is ensured while the strength and handling property of the wiring transfer sheet are improved. Specifically, the carrier base is preferably made of a metal foil such as a copper foil and a resin sheet.

In the wiring transfer sheet of the present invention, the wiring layer has concavities and convexities on a surface which is not in contact with the carrier base. The surface of the wiring layer which is not in contact with the carrier base is a surface which contacts a surface of an object (that is, an electrically insulating substrate for a wiring board) upon transferring. When the surface of the wiring layer which is in contact with the object has concavities and convexities, the interface area between the object and the wiring layer becomes larger, resulting in the improvement of the adhesion between the wiring layer and the electrically insulating substrate. The surface of the wiring layer which is not in contact with the carrier base preferably has convexities. In that case, an anchoring effect given by the convexities strengthens the adhesion between the wiring layer and the electrically insulating substrate in the wiring board.

In the wiring transfer sheet of the present invention, the carrier base and the wiring layer may be made of metals, each of which is selectively removed from the other. Such a wiring transfer sheet makes it possible to carry out the step of removing the carrier base by, for example, selective etching, after the wiring layer has been transferred. Selective etching makes it possible to remove the carrier base easily without causing stress in the carrier base. Therefore, selective etching effectively prevents the rough surface, particularly a fine convexity which is formed on the electrically insulating substrate, from breaking during the removal of the carrier base.

In the wiring transfer sheet of the present invention, a junction layer is preferably formed between the carrier base and the wiring layer from a material which is different from that of the wiring layer. The junction layer is specifically made of a metal or a metal oxide. The junction layer strengthens the adhesion between the wiring layer and the carrier base. The junction layer is useful in the case of forming a fine wiring pattern which tends to exfoliate from the carrier base.

In the wiring transfer sheet of the present invention, the carrier base is preferably made of a material through which a visible ray can pass. In the case where the carrier base is made from such a material, alignment markers of the wiring transfer sheet and alignment markers of the object are visible from one side at the time of superposing the wiring transfer sheet on the object. That is, these alignment markers can be recognized by one recognition system (such as a camera). Using one recognition system inhibits the lamination accuracy from lowering due to the difference in coordinates among a plurality of recognition systems, resulting in an improvement of lamination alignment accuracy of the wiring transfer sheet.

In the wiring transfer sheet of the present invention, the wiring layer may be buried in the carrier base. Here, the expression "a wiring layer is buried in a carrier base" means a state in which 50% or more of the thickness of the wiring layer is in the carrier base. By using such a wiring transfer sheet, the wiring layer is transferred so that it protrudes from the surface of the object, that is, so that the surfaces of the wiring layer and the electrically insulating substrate are not flush. When a semiconductor bare chip is mounted on a wiring board from which a wiring layer is protruding, the gap between the electrically insulating substrate and the semiconductor bare chip is wider. Into the wide gap, a sealing resin which is injected after mounting easily flows. When the sealing resin flows well into the gap, the reliability of mounting is improved. Therefore, the wiring transfer sheet in which the wiring layer is buried in the carrier base is preferably used, for example, when the wiring layer is formed on a surface of the electrically insulating substrate which is to be a mounting surface.

The present invention also provides a method for producing the above-described wiring transfer sheet of the present invention. Three methods are provided for producing the wiring transfer sheet of the present invention.

A first method for producing a wiring transfer sheet of the present invention includes: superposing on a surface of a carrier base a sheet of wiring material which has a rough surface while the rough surface contacts the surface of a carrier base. On the surface of the carrier base, another rough surface complementary to the rough surface of the sheet of the wiring material is formed. A wiring layer with a predetermined wiring pattern is formed by etching the sheet of the wiring material. A sheet of a wiring material (which is merely referred to as a "wiring material sheet") which has a rough surface contacts a carrier base, and then another rough surface complementary to the rough surface of the wiring material sheet is formed on a surface of the carrier base by, for example, pressurization. According to this method, a surface of the carrier base is easily roughened. A part of the rough surface formed in this manner is exposed by etching the wiring material sheet.

In this method, when the wiring material sheet which has a plurality of convexities on its surface is used, and the convexities are buried in the carrier base, a plurality of concavities complementary to the convexities can be formed on a surface of the carrier base. By using such a wiring material sheet, the convexities of the wiring layer adhere to the carrier base strongly by virtue of an anchoring effect, resulting in a structure in which the wiring layer enters the concavities on the surface of the carrier base in the wiring transfer sheet. Therefore, according to this method, the necessity of using an adhesive agent for bonding the carrier base and the wiring layer is eliminated.

A second method for producing a wiring transfer sheet of the present invention includes forming a wiring layer with a predetermined pattern on a surface of a carrier base, and roughening an exposed area of the surface of the carrier base on which surface the wiring layer is formed, by a roughing treatment. According to this method, the exposed surface of the carrier base is made any rough surface by appropriately selecting a condition of the roughening treatment. The roughening treatment is preferably carried out so that a plurality of concavities are formed on the exposed surface of the carrier base.

A third method for producing a wiring transfer sheet of the present invention includes forming a wiring layer by depositing a metal through metal plating, on a rough surface of a carrier base. According to this method, it is possible to use a carrier base on which a rough surface has been formed so that its profile becomes a predetermined one, which facilitates designing a surface shape of a wiring board as desired. Further, since a predetermined wiring pattern is deposited by plating, a finer wiring can be made. The rough surface of the carrier base preferably has a plurality of concavities.

In another aspect, the present invention provides a wiring board which is obtained by using a wiring transfer sheet of the present invention. A wiring board of the present invention is a wiring board obtained by transferring a wiring layer of a wiring transfer sheet of the present invention to a surface of an electrically insulating substrate. As to a surface of the wiring board which surface has the wiring layer, at least an exposed surface (i.e. an exposed area of a surface) of the electrically insulating substrate is a rough surface. Here, the term "at least" is used in the sense that it includes an embodiment in which only the area of a surface of a wiring board where the electrically insulating substrate is exposed (that is, the area on which wire is not disposed) is a rough surface, and an embodiment in which, as to a surface of a wiring board, the exposed area of the electrically insulating substrate and the surface of the wiring layer are rough surfaces. In this wiring board, a surface coplanarity which is required for mounting a semiconductor chip and an electronic component at a high density is realized, while the adhesiveness of the wiring board to a material laminated thereon is ensured by the rough surface.

More specifically, the wiring board of the present invention is one which is produced by a wiring transfer sheet in which an exposed area of a surface of a carrier base on which surface a wiring layer is formed has a plurality of concavities. In other words, the wiring board is one in which, as to a surface of the wiring board which surface has the wiring layer, at least an exposed surface of the electrically insulating substrate has a plurality of convexities. The meaning of "at least" is as described above. Such a wiring board adheres well to a resin laminated thereon since the convexities give an anchoring effect when the resin is laminated on the surface of the wiring board. In this specification, an electrically insulating substrate which is included in a wiring board may be referred to as an "electrically insulating layer."

The preferable shape and size of the concavity on the exposed surface of the electrically insulating substrate of the wiring board are as described above in connection with the concavity on the wiring transfer sheet. Therefore, the detailed description thereof is omitted here.

The wiring board of the present invention may be a multilayer wiring board having two or more electrically insulating substrates. In such a wiring board, at least one wiring layer is formed using the wiring transfer sheet of the present invention. Of course, it is preferable that all wiring layers are formed using the wiring transfer sheet of the present invention. In the wiring board after the wiring layer has been formed using the wiring transfer sheet of the present invention, the exposed surface of the electrically insulating substrate is a rough surface. Therefore, when another electrically insulating substrate is superposed on this wiring board, adhesion between the electrically insulating substrates becomes favorable.

The wiring board of the present invention may be a wiring board with a built-in component, in which a component connected with a wiring layer is embedded in the electrically insulating layer. Such a wiring board has different functions by the virtue of the component.

In the case where the wiring board with a built-in component is a multilayer wiring board, the component may extend with in two or more adjacent electrically insulating substrates. When the component is large, such a structure is required. As described below, the wiring board of this structure may be produced by stacking a plurality of electrically insulating substrates which are cured to some extent, but not cured completely. Then, a space (for example, a through hole) in which the component is to be placed is formed, and then disposing the component is arranged in the space.

In the wiring board of the present invention, the electrically insulating substrate preferably has through holes which are formed in the thickness direction of the substrate and which are filled with a conductive paste which electrically connects the wiring layers which are opposite through the electrically insulating substrate. By employing such a configuration, the wiring board of the present invention is provided with stacked via holes in the surface electrically insulating layer, which realizes a higher density wiring and makes it possible to ensure a larger area for mounting electronic components on the surface of the board. The electrically insulating substrate contains a resin as a matrix component. As the resin, a thermosetting resin is generally employed from the viewpoint of thermal stability. The resin may be a thermoplastic resin. In the case where the electrically insulating substrate contains a thermosetting resin, the resin is cured in a wiring board when using the board practically. As mentioned below, a wiring layer in which a part of or all of the thermosetting resin contained in the electrically insulating substrate is uncured or semi-cured does not function at all, or functions incompletely. The wiring board in such a state is referred to as a "wiring board intermediate" in this specification.

In the case where the wiring board of the present invention is provided with a built-in component, an electrically insulating substrate which has the built-in component may have the through holes filled with the conductive paste. Such a wiring board has a configuration wherein a layer with a built-in component has a via that connects wiring layers.

The present invention also provides a method for producing a wiring board of the present invention. As methods for producing the wiring board of the present invention, a first and a second methods are provided.

The first method for producing a wiring board of the present invention is one in which the step of forming at least one of wiring layers which are disposed through an electrically insulating substrate on both surfaces of an electrically insulating substrate includes (1) superposing a wiring transfer sheet of the present invention (that is, a wiring transfer sheet including a carrier base and a wiring layer formed on the carrier base, wherein at least an exposed area of a surface of the carrier base on which the wiring layer is formed is a rough surface) on at least one surface of the electrically insulating substrate which has through holes filled with a conductive paste. (2) The wiring layer of the wiring transfer sheet is adhered to the electrically insulating substrate, an exposed area of a surface of the electrically insulating substrate which includes thus transferred wiring layer (that is, an area of the surface on which area no wire is present) is roughened, through heating and pressurizing a layered body which consists of the wiring transfer sheet and the electrically insulating substrate. (3) The carrier base of the wiring transfer sheet is removed. According to this method, a wiring board which has the above-mentioned features is produced. In this method, by using a wiring transfer sheet which has a plurality of concavities on the exposed area of the surface of the carrier base, convexities complementary to the concavities are formed on the exposed surface of the electrically insulating substrate.

According to the method, a multilayer wiring board can be produced efficiently. In a method for producing the multilayer wiring board, for example, a substrate which contains an uncured thermosetting resin is used as the electrically insulating substrate, and the electrically insulating substrate on which the wiring transfer sheet is superposed is superposed on a wiring board or a wiring board intermediate (an intermediate of a wiring board) in step (1) followed by adhering the electrically insulating substrate to a surface of the wiring board or the wiring board intermediate through heating and pressurization. Here, a wiring board intermediate means a structure which has stacked wiring layer(s) and stacked electrically insulating substrate(s), but does not function at all or functions insufficiently as a wiring board. The wiring board intermediate is, for example, one in which the electrical connection between the wiring layers is insufficient. A more specific example of the wiring board intermediate is one in which a part of or all of a thermosetting resin is not cured completely, and the resin is contained as a matrix component in the electrically insulating substrate that has through holes filled with a conductive paste. According to this method in which the electrically insulating substrate is superposed on the wiring board or the wiring board intermediate, a multilayer wiring board in which two or more wiring layers are formed with the wiring transfer sheet of the present invention is efficiently produced by repeating steps (1) to (3).

In the case where the steps (1) to (3) are repeated using an electrically insulating substrate containing an uncured thermosetting resin, in each step (2), heating and pressurization may be conducted under the condition that the thermosetting resin is pre-cured so that the wiring layer of the wiring transfer sheet is temporarily adhered to the electrically insulating substrate and an exposed area of a surface of the electrically insulating substrate on which the wiring layer is formed is roughened. The electrically insulating substrate is temporarily adhered to a wiring board or a wiring board intermediate. In the final step (2), heating and pressurization may be carried out under the condition that the thermosetting resin contained in all electrically insulating substrates is post-cured. Pre-curing of a thermosetting resin contained in an electrically insulating substrate means that the thermosetting resin which is in a state in which the resin constitutes the electrically insulating substrate (for example, a semi-cured state) is further cured but not cured completely. The pre-cured thermosetting resin can be further cured by heating and pressurization. Post-curing of a thermosetting resin contained in an electrically insulating substrate means that the thermosetting resin is cured so as to be in a state in which the resin cannot be further cured or a state close to this state.

Therefore, pre-curing is carried out using a temperature and a pressure which are lower than those used in post-curing. A thermosetting resin is pre-cured or post-cured via a tacky state. Therefore, when step (2) is carried out under the condition that the thermosetting resin is pre-cured or post-cured, the wiring layer is adhered to the electrically insulating substrate. Further, in the case where the electrically insulating substrate is superposed on a wiring board or a wiring board intermediate, pre-curing of the thermosetting resin allows the electrically insulating substrate to adhere to the wiring board or the wiring board intermediate. However, the extent of adhesion (adhesive strength) obtained by pre-curing is lower than that obtained by post-curing. Therefore, in this specification, the adhesion obtained by pre-curing of a thermosetting resin is referred to as a "temporary adhesion."

In a production method in which steps (1) to (3) are repeated, the thermosetting resin contained in all the electrically insulating substrates is post-cured together in the final wiring transfer step. The technique of post-curing together shortens a manufacturing time significantly. Further, according to this technique, it is possible to prevent the electrically insulating substrates which have been stacked from changing in dimension after every pro-curing of a newly stacked electrically insulating substrate. Therefore, a finer wiring board of higher quality can be obtained. Alternatively, in every step (2), (when each of the steps (1) to (3) is carried out only once, in the step (2) carried out only once), heating and pressurization may be conducted under the condition that the thermosetting resin contained in the electrically insulating substrate is pre-cured. In that case, a wiring board intermediate is obtained. Such an intermediate can be used, for example, for producing a wiring board in which a component is disposed in an electrically insulating substrate, as mentioned below.

In the method for producing a multilayer wiring board by repeating steps (1) to (3), electrically insulating substrates are preferably superposed on both surfaces of the wiring board or the wiring board intermediate in step (1). Such superposition is preferably conducted when the temporary adhesion of the electrically insulating substrates is carried out in sequence by pre-curing the thermosetting resin contained in the electrically insulating substrates followed by post-curing the thermosetting resin together in the final wiring transfer step. When the electrically insulating substrate is temporarily adhered to one surface of the wiring board, the thermosetting resin contained in the electrically insulating substrates which have been superposed is further cured gradually by heat applied during every temporary adhesion. As a result, displacement of the wiring layer and/or warpage of the wiring board occur due to hardening shrinkage of the electrically insulating substrate, which results in failure to obtain a desired wiring board. Such trouble is reduced or eliminated by disposing two electrically insulating substrates above and below the wiring board or the wiring board intermediate followed by temporarily adhering them to the wiring board or the wiring board intermediate.

The second method for producing a wiring board of the present invention includes superposing an electrically insulating substrate on a surface of a wiring transfer sheet of the present invention which surface has a wiring layer. (2) Through holes are formed to expose the wiring layer of the wiring transfer sheet. (3) The through holes are filled with a conductive paste, and (4) the wiring transfer sheet is superposed on a wiring board or a wiring board intermediate through the electrically insulating substrate. (5) A layered body which consists of the wiring transfer sheet, the electrically insulating substrate, and the wiring board or the wiring board intermediate is heated and pressurized, so that the wiring layer of the wiring transfer sheet adheres to the electrically insulating substrate, and an exposed area of a surface of the electrically insulating substrate on which surface the wiring layer is formed is roughened, while the electrically insulating substrate adheres to the wiring board or the wiring board intermediate. (6) The carrier base of the wiring transfer sheet is removed. In this production method, by using a wiring transfer sheet in which an exposed surface of the carrier base has a plurality of concavities, convexities complementary to the concavities are formed on an exposed area of a surface of the electrically insulating substrate.

This method corresponds to a method for obtaining a multilayer wiring board, in which another electrically insulating substrate is superposed on a wiring board or a wiring board intermediate on which a wiring layer has been formed, and then a wiring layer is formed on the electrically insulating substrate. In this production method, a wiring transfer sheet is superposed (that is, bonded) to an electrically insulating substrate, and then the electrically insulating substrate is superposed on the wiring board or the wiring board intermediate. Therefore, according to this production method, the productivity of the wiring board can be improved. Further, according to this production method, the alignment accuracy is improved since positions where through holes are to be formed are adjusted by recognizing a position of a wiring pattern formed on the wiring transfer sheet. Therefore, the through holes can be formed on a finer wiring. As a result, a wiring pattern of a higher density can be formed with a higher accuracy. In this production method, repeating the steps (1) to (6) makes it possible to produce a multilayer wiring board efficiently by forming wiring layers with wiring transfer sheets of the present invention.

In the second production method, like the first production method, an electrically insulating substrate which contains an uncured thermosetting resin is used as the electrically insulating substrate. In each step (5), heating and pressurization may be conducted under the condition that the thermosetting resin is pre-cured so that the wiring layer of the wiring transfer sheet is temporarily adhered to the electrically insulating substrate and an exposed area of a surface of the electrically insulating substrate on which the wiring layer is formed is roughened, and the electrically insulating substrate is temporarily adhered to a wiring board or a wiring board intermediate. In the final step (5), heating and pressurization may be carried out under the condition that the thermosetting resin contained in all electrically insulating substrates is post-cured. That is, also in the second production method, the thermosetting resin contained in each electrically insulating substrate can be post-cured together in the last wiring transfer step. The effect given by this operation is as described in connection with the first production method. Alternatively, in every step (5), (when each of the steps (1) to (6) is carried out only once, the step (5) is carried out only once), heating and pressurization may be conducted under the condition that the thermosetting resin contained in the electrically insulating substrate is pre-cured. In that case, a wiring board intermediate is obtained. Such an intermediate can be used, for example, for producing a wiring board wherein a component is disposed in an electrically insulating substrate, as mentioned below.

In the method for producing a multilayer wiring board by repeating the steps (1) to (6), wiring transfer sheets on which the electrically insulating substrates are superposed are preferably superposed on both surfaces of the wiring board or the wiring board intermediate in step (4). Such a superposition is preferably conducted when the temporary adhesion of the electrically insulating substrates are carried out in order by pre-curing the thermosetting resin contained in the electrically insulating substrates followed by post-curing the thermosetting resin together in the final wiring transfer step. The effect given by this superposition is as described above in connection with the first production method.

The present invention also provides a method for producing a wiring board with a component disposed in an electrically insulating substrate, which includes (A) superposing an electrically insulating substrate having through holes filled with a conductive paste on a wiring board or a wiring board intermediate. (B) A laminate is obtained by heating and pressurizing a layered body which consists of the electrically insulating substrate and the wiring board or the wiring board intermediate so as to adhere the electrically insulating substrate to the wiring board or the wiring board intermediate. (C) A space is formed within the laminate in which space a component is to be placed. (D) The component is mounted on a wiring layer-formed surface of a wiring transfer sheet of the present invention. (E) The wiring transfer sheet is superposed on the laminate so as to dispose the component in the space. (F) Heating and pressurization are performed so that the wiring layer of the wiring transfer sheet adheres to the electrically insulating substrate, and an exposed area of a surface of the electrically insulating substrate on which surface the wiring layer is formed is roughened, while a void around the component is filled with the resin contained in the laminate. (G) The carrier base of the wiring transfer sheet is removed. This production method is characterized in that a space in which the component is to be received is formed after making the laminate dependant on the kind and size of the component. Further, this production method is characterized in that the component is previously mounted on the wiring layer of the wiring transfer sheet, and then disposition of the component in the electrically insulating substrate and transfer of the wiring layer are carried out at the same time. Further, this production method is characterized in that the void formed after disposing the component in the space is filled with the resin contained in the laminate (i.e. the resin contained in the electrically insulating substrate), by forcing the resin to flow at the same time as the transfer of the wiring layer. According to this production method with these features, the component can be disposed in the electrically insulating substrate with ease.

The wiring board or the wiring board intermediate employed in the step (A) may be one produced according to the production method of the present invention. Preferably, the wiring board intermediate is used. The method for producing the wiring board intermediate is as described in connection with the first and the second production methods for producing the wiring board of the present invention.

The space formed in the step (D) may be a hole which penetrates the laminate or a recess. In the step (F), the void which is formed after disposing the component in the space is filled in by forcing the surrounding resin which constitutes the laminate to flow into it. The resin which constitutes the laminate is a resin contained in an electrically insulating layer of the wiring board or the wiring board intermediate used in the step (A), or a resin contained in the electrically insulating substrate employed in the step (A). The resin is an uncured thermosetting resin or a thermoplastic resin. The viscosity of the resin is lowered by subjecting the resin to heating and pressurization treatment, resulting in flow of the resin.

In the case where the electrically insulating substrate containing an uncured thermosetting resin is used in step (A), heating and pressurization are preferably conducted under the condition that the thermosetting resin is pre-cured in the step (B). If the thermosetting resin is post-cured in the step (B), the thermosetting resin cannot flow in the step (F).

The void which is formed in the laminate after disposing the component in the space is easily and securely filled when the void is surrounded by a resin which can flow by heating and pressurization. Therefore, in step (C), when a hole which penetrates the laminate in the thickness direction is formed as the space, a wiring board intermediate in which all electrically insulating layers contain an uncured thermosetting resin is preferably used in step (A). When a recess is formed in the laminate as the space, a wiring board intermediate in which at least electrically insulating layer(s) where the recess is to be positioned contains an uncured thermosetting resin is preferably used in step (A). Alternatively, a wiring board or a wiring board intermediate in which a part of or all of the electrically insulating substrates contain a thermoplastic resin can be used. However, in some case, the void around the component is fully filled when at least one of the electrically insulating substrates constituting the laminate contain a resin which can flow. In such a case, for filling the void, it suffices to use the electrically insulating substrate containing a resin which can flow by heating and pressurization, that is, an uncured thermosetting resin or a thermoplastic resin, in step (A).

In step (A) of this production method, the wiring board or the wiring board intermediate can be produced by employing the above-mentioned first method for producing the wiring board. That is, the following step (A') is carried out in place of the step (A). The step (A') is a step for obtaining a laminate, wherein a wiring board or a wiring board intermediate is produced by a method that includes (1) superposing a wiring transfer sheet of the present invention on an electrically insulating substrate having through holes filled with a conductive paste. (2) Heating and pressurization are performed so as to adhere the wiring layer of the wiring transfer sheet to the electrically insulating substrate and to roughen an exposed area of a surface of the electrically insulating substrate on which surface the wiring layer is formed. (3) The carrier base of the wiring transfer sheet is removed. Then, another electrically insulating substrate having through holes filled with a conductive paste is disposed on the thus produced wiring board or the wiring board intermediate. When the electrically insulating substrate used in the step (1) contains an uncured thermosetting resin, and heating and pressurization are conducted under the condition that the thermosetting resin contained in the electrically insulating substrate is pre-cured in step (2), a wiring board intermediate is obtained. When such a wiring board intermediate is produced in the step (A'), heating and pressurization are preferably carried out under the condition that the thermosetting resin is post-cured in all electrically insulating substrates, in step (E).

Further, the other electrically insulating substrate which is superposed on the wiring board or the wiring board intermediate produced in the step (A') may be one containing an uncured thermosetting resin. Such an electrically insulating substrate may be disposed on a wiring board intermediate in which electrically insulating layer(s) contain an uncured thermosetting resin. In that case, it is preferable that the kind of the thermosetting resin contained in this other electrically insulating substrate is the same as that contained in the wiring board intermediate.

In the step (A'), the step (1) may further include superposing the electrically insulating substrate on which the wiring transfer sheet is superposed, on the surface of a wiring board or a wiring board intermediate which has been previously produced. The step (2) may further include adhering the electrically insulating substrate to the surface of the wiring board or the wiring board intermediate. In that case, in the step (A'), a multilayer wiring board is obtained. The wiring board or the wiring board intermediate which has been produced previously may be produced according to the production method of the present invention.

Furthermore, by carrying out the steps (1) and (2) in this manner and repeating the steps (1) to (3), a multilayer wiring board can be made depending on the size and kind of component to be disposed. When repeating the steps (1) to (3), the electrically insulating substrate containing an uncured thermosetting resin is preferably used in the repeated steps (1), and heating and pressurization are conducted under the condition that the thermosetting resin is pre-cured in the repeated steps (2), and the uncured thermosetting resin is together post-cured in the step (E).

According to the present invention, it is possible to make a surface of a wiring board a rough surface, while ensuring surface coplanarity which is required for high density mounting of a semiconductor bare chip or an electronic component. When the surface of the wiring board is a rough surface, the contact area between the wiring board and a resin stacked thereon is increased so that the adhesion between them is improved. Further, according to the present invention, a surface of the wiring board can be made a rough surface having fine convexities. When a resin is stacked on a wiring board having such a rough surface, the convexities provide an anchoring effect, which improves the adhesion between the wiring board and the resin.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
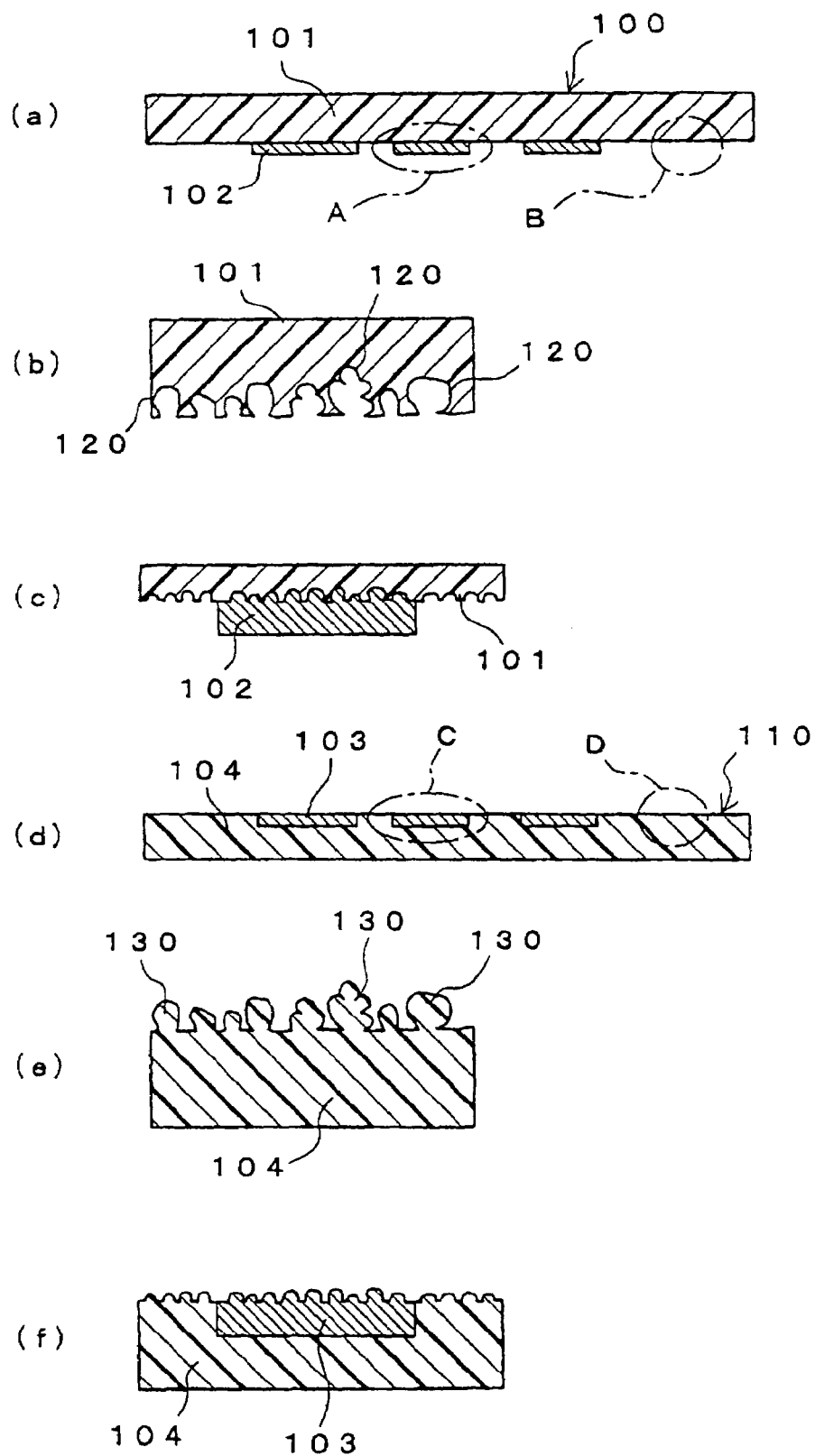
FIG. 1(a) shows a schematic cross-sectional view of a wiring transfer sheet of Embodiment 1 of the present invention.
FIGS. 1(b) and 1(c) show enlarged cross-sectional views of Areas B and A in the wiring transfer sheet shown in FIG. 1(a) respectively.
FIG. 1(d) shows a schematic cross-sectional view of a wiring board wherein a wiring layer is transferred with the wiring transfer sheet shown in FIG. 1(a), and FIGS. 1(e) and 1(f) show enlarged cross-sectional views of Areas D and C in the wiring board shown in FIG. 1(d), respectively.

In the following, embodiments of wiring transfer sheets of the present invention are described.

The wiring transfer sheet of the present invention is a sheet which includes a carrier base and a wiring layer. The carrier base is preferably made from a material which is not compatible with an electrically insulating substrate which is an object to which the wiring layer is to be transferred, by heating and pressurizing a layered body which consists of the wiring transfer sheet and the object upon transferring the wiring layer. The material for the carrier base is selected from an organic resin and a metal, depending on the material of the electrically insulating substrate. When the electrically insulating substrate contains an epoxy resin, a polyimide resin, a cyanate resin, a polyphenylene ether (PPE) resin, or a polytetrafluoroethylene resin, the carrier base is preferably made from a material selected from polyimide, a fluorine-containing resin, and a heat resistant epoxy resin. Further, the carrier base is preferably made from a material which is peeled off from the wiring layer in a step of removing the carrier base. From this viewpoint, the carrier base is preferably made of a polyimide resin or a fluorine-containing resin.

When the carrier base is made of a thermosetting resin, it is necessary to take care of the compatibility between the resin constituting the carrier base and a resin constituting the electrically insulating substrate. For example, when the carrier base is made of an epoxy resin and the electrically insulating substrate contains an epoxy resin, the viscosity of the epoxy resin which is not cured completely in the carrier base reduces during the step of transferring the wiring layer, and then mixes with the epoxy resin in the electrically insulating substrate, resulting in a failure to form convexities complementary to concavities formed on the carrier base, on the electrically insulating substrate. When the carrier base is made of a thermoplastic resin and the step of transferring the wiring layer is conducted under the condition that the resin is softened, the same problem is caused. Therefore, when using a thermoplastic resin sheet as the carrier base, the sheet is required to have heat resistance.

The thickness of the carrier base is selected depending on its material. Generally, it is preferably in the range of 10 to 100 μm. When the carrier base is thin, this tends to cause problems in that handling property thereof is bad, the strength thereof is decreased, and the carrier base tends to be wrinkled. When the carrier base it too thick, there is a tendency that the carrier base is difficult to be peeled off.

The carrier base is preferably made from a material through which a visible ray can pass. Such materials include a polyimide resin, a fluorine-containing resin and a heat resistant epoxy resin. When the carrier base is made from any one of these materials, its thickness is preferably 100 μm or less for ensuring the transmission of the visible ray.

A surface of the carrier base on which the wiring layer is to be formed may be subjected to a releasing treatment. By subjecting the surface to the releasing treatment, the carrier base is peeled off easily from the object without damaging a rough surface, especially convexities formed on the surface of the object after the wiring layer has been transferred. The releasing treatment is conducted by coating a silicone resin to a thickness of between 0.01 and 1 μm on the surface of the carrier base on which the wiring layer is to be formed.

When the carrier base is made of a metal, it is preferable that the metals constituting the carrier base and the wiring layer are each removed selectively. Thereby, only the carrier base is removed by etching after the wiring layer has been transferred. The combinations of the carrier base/the wiring layer include aluminum/copper, and stainless/copper. When the metals constituting the carrier base and the wiring layer each cannot be removed selectively, an etching-stopper layer is preferably provided between the carrier base and the wiring layer. The material for the etching-stopper layer is selected depending on the combination of the carrier base and the wiring, and the kind of etchant. For example, when the combination of the carrier base/the wiring layer is copper/copper and the carrier base is removed by etching with a sulphuric acid/oxygenated water, the etching-stopper layer is preferably made of titanium.

The carrier base may be a laminate comprising a plurality of layers. In that case, the layer which has a surface on which the wiring layer is to be formed (this layer is also referred to as a "wiring-forming layer") may be a layer formed from a material which is not compatible with the electrically insulating substrate. Such materials have been exemplified above. When the carrier base is the laminate, it is particularly preferable that the wiring-forming layer is formed from an organic resin such as a fluorine-containing resin. The thickness of the wiring-forming layer is preferably in the range of 5 to 60 μm.

The other layer(s) which are laminated on the wiring-forming layer preferably include a layer which gives strength and a rigidity to the wiring transfer sheet. This layer is also referred to as a "supporting layer." The preferable supporting layer is specifically a metal foil having a thickness of between 30 and 100 μm (for example, an aluminum foil, a copper foil or a stainless foil) or a resin film having a thickness of between 50 and 200 μm (for example, a PET film or a PEN film). More preferably, a copper foil is used. When the wiring layer is made of copper, the use of a copper foil as the supporting layer prevents the wiring transfer sheet from warping since the same material is positioned on both surface sides of the carrier base. Alternatively, the supporting layer may be a layer made of a thermally foaming resin (for example, REVALPHA (trade name) available from NITTO DENKO CORPORATION). The supporting layer is made of two or more layers.

As described above, the carrier base may be a sheet made of an organic resin. However, dimensional change of the organic resin sheet tends to be caused by heating, and it may be caused at the time of forming a wiring layer into a desired pattern by etching. It is desirable that the dimensional change of the carrier base is avoided because the dimensional change causes displacement of wire. Therefore, when the organic resin sheet is used as the carrier base, the carrier base is preferably made as a two-layer structure by superposing the supporting layer such as a metal foil on a surface which is opposite to the surface on which the wiring layer is to be formed, so that the dimensional change lessens or does not occur.

The supporting layer is removed together with the wiring-forming layer after the wiring layer has been transferred. When the supporting layer is made of a metal, etching is a simple method for removing the supporting layer. When the supporting layer is made of a thermally foaming resin, it is easily removed by heating upon transferring the wiring layer. When the supporting layer is made of a material whose heat resistance is low (for example, a resin), it is necessary to remove the supporting layer before transferring the wiring layer. In that case, the removal of the supporting layer is carried out by, for example, breaking or removing the portion where the supporting layer and the wiring layer are fixed to each other (for example, a bonded point formed by using an adhesive agent).

When the carrier base is made of a plurality of layers, the layers may be fixed to each other over the entire interface between the layers, or at a part of the entire interface (for example, at the periphery). When one of the layers has adhesiveness, the fixation between the layers may be conducted by using the adhesiveness of the layer. Alternatively, the fixation may be conducted by using an adhesive agent.

The wiring layer of the wiring transfer sheet is made from a conductive material which is generally used as a material for a wiring layer of a wiring board. Specifically, the wiring layer is made of copper, a copper alloy, or silver. Further, the wiring layer has a predetermined pattern depending on a wiring pattern which is to be formed on a wiring board. In the wiring transfer sheet, the wiring layer is buried in the carrier base so that the wiring layer protrudes from (or is buried in) the electrically insulating substrate as desired in a wiring board after the wiring layer has been transferred to the board. For example, the wiring layer is buried in the carrier base so that the surface thereof is flush with the surface of the carrier base. In that case, almost the entire thickness of the wiring layer which is formed on the electrically insulating substrate protrudes from the electrically insulating substrate.

A surface of the wiring layer which does not contact the carrier base is preferably a rough surface. It is particularly preferable that the rough surface has a plurality of convexities. The reason for this is as described above. As described below, the convexities formed on the surface of the wiring layer are formed by depositing metal particles on the originally flat surface of a metal foil (for example, a copper foil) through electrolytic plating under the condition selected appropriately. In the convexity, of the sections which are parallel to the surface of the wiring layer, the section having the maximum area preferably has a diameter of between 1 and 10 μm. Further, the convexity has a height of between 0.5 and 5 μm. Here, the height of the convexity is the shortest distance between the basis and the top of the convexity. More preferably, the convexity has a shape which swells at the waist, such as a mushroom-shape, a bump-shape or a bud-shape, so that it can provide a greater anchoring effect. As described above, the convexity of such a shape is formed by depositing fine metal particles so that they are flocculated and/or piled up through electrolytic plating under the appropriately-selected condition.

Figure 15:
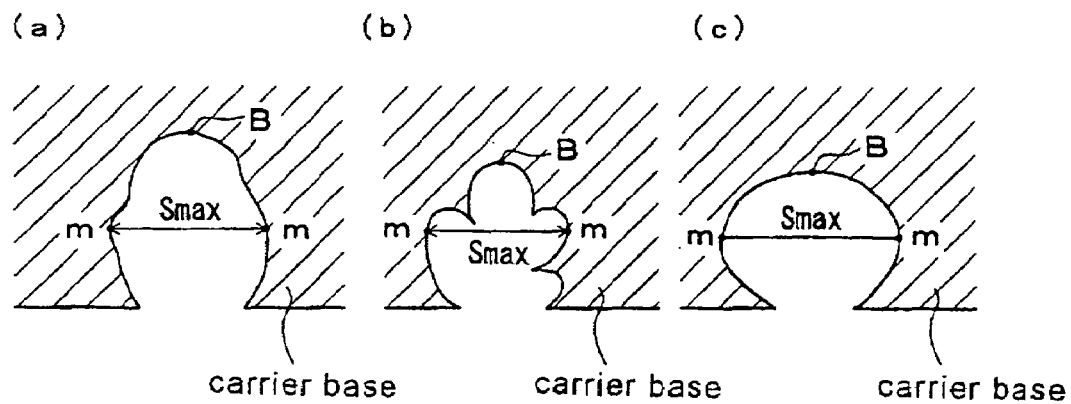
FIGS. 15(a) to 15(c) show embodiments of concavities of a wiring transfer sheet of the present invention.

In the wiring transfer sheet of the present invention, at a position where no wire is formed as a result of patterning, a surface of the carrier base is exposed. The exposed surface of the carrier base is a rough surface, and preferably has a plurality of fine concavities. As described above, the concavities serve to form convexities whose shapes are complementary to the concavities. As described above with reference to FIG. 15, the concavity preferably has a shape wherein the area of the section which is perpendicular to the thickness direction of the carrier base (that is, a section along the direction parallel to the surface of the carrier base) is greatest at an intermediate position between the surface and the bottom of the carrier base. The shapes of the concavities are not limited to those shown in FIG. 15 and may be other ones. The preferable proportion of the concavities on the exposed surface of the carrier base and the preferable size of each concavity are as described above. The concavities do not necessarily have the same size and the same shape in one wiring transfer sheet. Generally, concavities which differ in size and/or shape exist in one wiring transfer sheet. The concavities are preferably distributed uniformly.

As described above, a junction layer may be interposed between the carrier base and the wiring layer. The junction layer is made of a metal which is different from the wiring layer, or an oxide of metal. Specifically, the junction layer is made from a material selected from Cr, Zn, Ni, and the oxides thereof. The thickness of the junction layer is preferably in the range of 0.01 to 1 µm. When the junction layer is too thick, the junction layer which remains on the surface of the wiring layer after the wiring layer has been transferred may adversely affect the electrical connection between the wiring layers. Since an organic resin is difficult to adhere to copper, the junction layer is preferably provided when the carrier base is made of an organic resin and the wiring layer is made of copper.

Next, an electrically insulating substrate for a wiring board is described. The electrically insulating substrate is the object to which the wiring layer of the wiring transfer sheet of the present invention is to be transferred. Any one of the electrically insulating substrates which are conventionally used as electrically insulating substrates for a wiring board may be used. A porous substrate which can be compressed or a three-layer structure substrate wherein adhesive layers are formed on both surfaces of a core film is generally used as the electrically insulating substrate. Specifically, a resin impregnated fibrous sheet can be used as the electrically insulating substrate, which is obtained by impregnating a non-woven fabric, a woven fabric or a paper with a thermosetting resin followed by semi-curing the resin. More specifically, a composite substrate in which a sheet of glass fibers or aramid fibers is impregnated with an epoxy resin or a bismaleimide triazine (BT) resin can be used. Since these composites are porous substrates which can be compressed, when the electrically insulating substrate has through holes filled with a conductive paste as described below, the composites allow the conductive paste to be subjected to a compression effect. Alternatively, a substrate containing a thermoplastic resin such as a polyetheretherketone (PEEK) resin, a polyetherimide resin, a PTFE resin or a liquid crystal polymer can be used as the electrically insulating substrate. The surface of the electrically insulating substrate on which the wiring layer is to be formed has little swell and coplanarity which is required for mounting a semiconductor bare chip or an electronic component at a higher density.

As described above, the electrically insulating substrate preferably has through holes that are formed in a thickness direction and are filled with a conductive paste. The size and the position of each through hole are selected so that the wiring layers are connected as desired. The through holes are formed by a conventional method. Specifically, the through holes are formed through a laser process using a carbon dioxide laser, an eximer laser or a YAG laser. Any one of the conductive pastes which are used in the production process of the above-mentioned All Layers IVH structure resin multilayer wiring board, may be used. The conductive paste is specifically a paste which is made of powder of Cu, Ag, Pd, or an alloy thereof, and a resin such as an epoxy resin or a phenol resin. The resin component is in a state of cured in an end product. Further, the conductive paste ensures the electrical connection between the wiring layers by being densified in the wiring board by being subjected to a compression effect.

Further, in the wiring board of the present invention, a component connected with the wiring layer is disposed in an electrically insulating substrate. The component is, for example, a passive component such as LCR, a SAW filter, or a TCXO. The component may be disposed in one electrically insulating layer, or may stretch from one electrically insulating layer to another one or two electrically insulating layers depending on its size.

Hereinafter, more specific embodiments of the wiring transfer sheets and the wiring boards of the present invention are described with reference to the drawings.

Embodiment 1

In FIG. 1, a wiring transfer sheet of Embodiment 1 of the present invention and a wiring board which is produced using the wiring transfer sheet are schematically shown in sectional views. FIG. 1(a) shows a wiring transfer sheet 100 wherein a wiring layer 102 is formed in a predetermined pattern on a surface of a carrier base 101. FIG. 1(b) shows an enlarged view of Area B which is an exposed area of a surface of the carrier base on which the wiring layer is formed. FIG. 1(c) shows an enlarged view of Area A in the vicinity of the wiring layer of the wiring transfer sheet. FIG. 1(d) shows a wiring board 100 which is obtained by transferring a wiring layer 103 to an electrically insulating substrate 104 using the wiring transfer sheet shown in FIG. 1(a). FIG. 1(e) shows an enlarged view of Area D that is an exposed surface of the electrically insulating substrate, which is a part of a surface of the wiring board which surface has the wiring layer. FIG. 1(f) shows an enlarged view in the vicinity of the wiring layer of the wiring board.

As shown in FIG. 1(c), the wiring layer 102 is formed on a surface of the carrier base 101 in a state in which the wiring layer 102 enters concavities which are formed on the surface of the carrier base 101. That is, the interface between carrier base 101 and the wiring layer 102 is uneven. Therefore, the contact area between the carrier base 101 and the wiring layer 102 is larger compared with a case in which the interface between them is flat. For this reason, they adhere to each other so that the wiring layer is well carried on the carrier base without an adhesive layer therebetween, until the wiring is transferred to an object. Nonuse of an adhesive agent is convenient because the adhesive agent does not remain on a surface of the wiring layer after the wiring layer has been transferred. The method for obtaining such an interface is described below. As shown in FIG. 1, in this wiring transfer sheet 100, the exposed surface of the wiring layer 102 is flat.

The wiring board is obtained by superposing the wiring transfer sheet on an electrically insulating substrate for a wiring board with the wiring layer in contact with a surface of the electrically insulating substrate followed by heating and pressurization so as to transfer the wiring layer to the electrically insulating substrate. The structure of the wiring layer thus obtained is as shown FIG. 1(d). In this wiring board 110, the wiring layer 103 is entirely buried in the electrically insulating substrate 104, and an exposed surface of the wiring layer 103 is flush with an exposed surface of the electrically insulating substrate 104. This is because the wiring layer 102 protrudes in the wiring transfer sheet 100 shown in FIG. 1(a). During the step of transferring the wiring layer, pressure is applied so that the wiring layer is brought into contact with the object without a gap therebetween, whereby the protruding wiring layer is buried in the electrically insulating substrate.

As shown in FIG. 1(e), in the wiring board 110, convexities 130 complementary to concavities 120 of the wiring transfer sheet 100 are formed on an exposed surface of the electrically insulating substrate 104. A material of the electrically insulating substrate flows into the concavities while the transfer of the wiring layer is carried out, which results in forming these concavities. Each of the convexities is a bump-shaped, a bud-shaped, or a mushroom shaped one. The convexities of these shape provide a greater anchoring effect than the convexities whose sectional areas parallel to the surface of the wiring board are uniform (for example, a column-shape convexity) when a resin is laminated thereon, resulting in improved adhesion between the wiring board and the laminated material.

Further, as shown in FIG. 1(f), this wiring board has fine convexities on a surface of the wiring layer 103. This is because the interface between the wiring layer 102 and the carrier base 103 is uneven in the wiring transfer sheet and the convexities of the wiring layer 102 are exposed by peeling off the carrier base after the wiring layer has been transferred. The convexities on the wiring layer 103, as well as the convexities on the electrically insulating substrate 104, contribute to the increase of the contact area between the wiring layer and the stacked resin, and provide an anchoring effect. Therefore, this wiring board in which the convexities exist on not only the surface of the electrically insulating substrate but also the surface of the wiring layer, strongly adheres to the resin stacked thereon.

(Embodiment 2)

Figure 2:
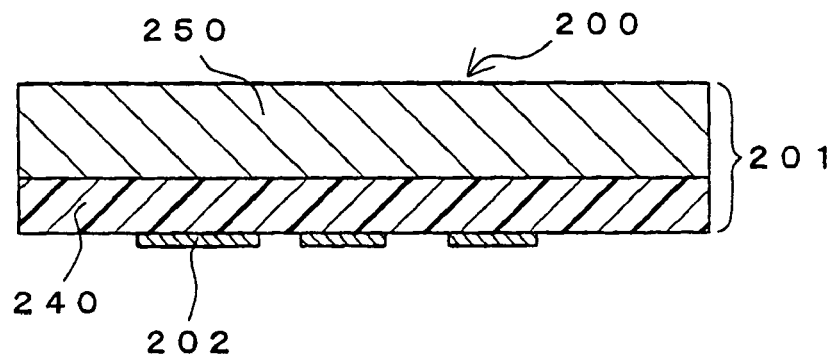
FIG. 2 shows a schematic cross-sectional view of a wiring transfer sheet of Embodiment 2 of the present invention.

In FIG. 2, a wiring transfer sheet of Embodiment 2 of the present invention is schematically shown in sectional view. In a wiring transfer sheet 200 shown in FIG. 2, a carrier base 201 is formed of a wiring-forming layer 240 and a supporting layer 250, and a wiring layer 202 is formed on a surface of the wiring forming layer 240. In this wiring transfer sheet 200, the concavities (not shown) are formed on an exposed surface of the wiring-forming layer. The materials suitable for constituting the wiring-forming layer 240 and the supporting layer 250 are as described above. More specifically, as a combination of supporting layer/wiring forming layer, a copper foil/a fluorine-containing resin is exemplified.

(Embodiment 3)

Figure 3:
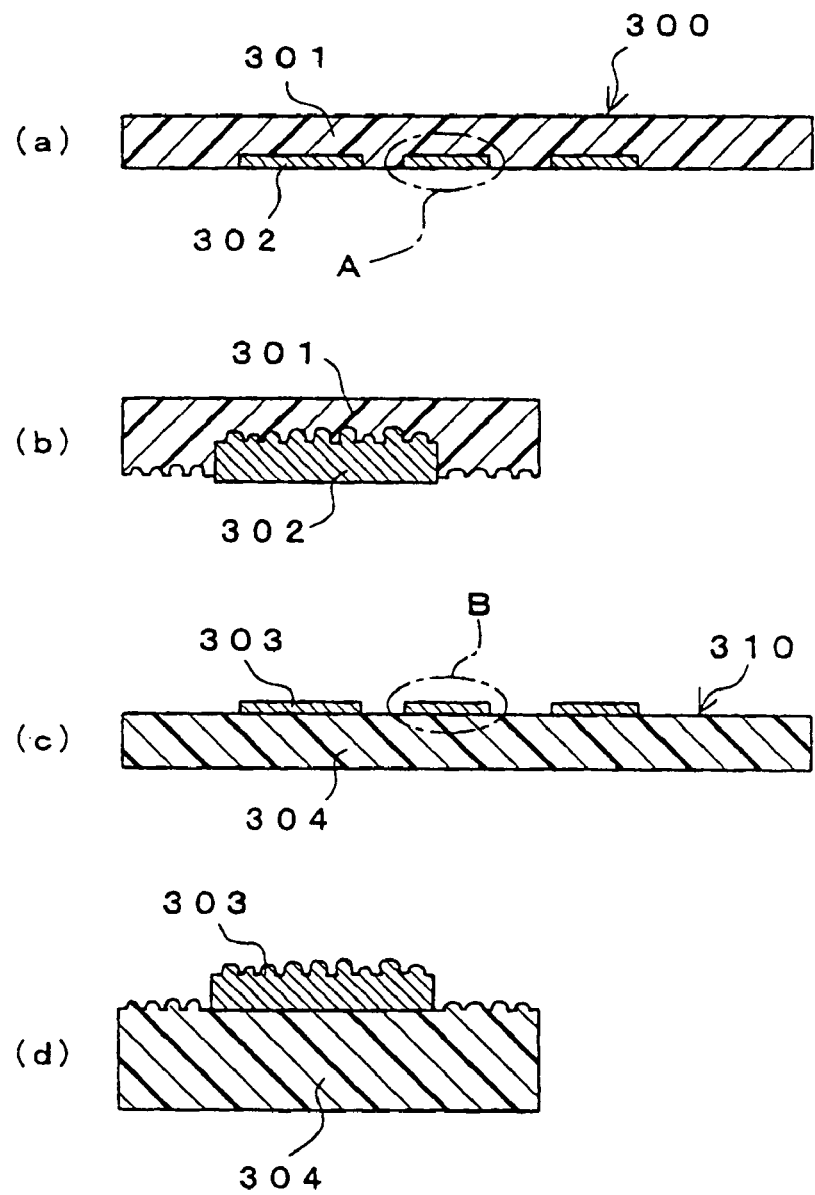
FIG. 3(a) shows a schematic cross-sectional view of a wiring transfer sheet of Embodiment 3 of the present invention.
FIG. 3(b) shows an enlarged cross-sectional view of Area A in the wiring transfer sheet shown in FIG. 3(a)
FIG. 3(c) shows a schematic cross-sectional view of a wiring board wherein a wiring layer is transferred with the wiring transfer sheet shown in FIG. 3(a)
FIG. 3(d) shows an enlarged cross-sectional view of Area B in the wiring board shown in FIG. 3(c)

In FIG. 3, a wiring transfer sheet of Embodiment 3 of the present invention and a wiring board which is produced using the wiring transfer sheet are schematically shown in sectional views. FIG. 3(a) shows a wiring transfer sheet 300 wherein a wiring layer 302 is buried in a carrier base 301. FIG. 3(b) shows an enlarged view of Area A in the vicinity of the wiring layer of the wiring transfer sheet. FIG. 3(c) shows a wiring board 310 which is obtained by transferring a wiring layer 303 to an electrically insulating substrate 304 using the wiring transfer sheet shown in FIG. 3(a). FIG. 3(d) shows an enlarged view of Area B in the vicinity of the wiring layer of the wiring board.

As shown in FIG. 3(b), almost the entire thickness of the wiring layer 302 is buried in the carrier base 301 so that a surface of the wiring layer 302 is substantially flush with a surface of the carrier base 301. Such a wiring transfer sheet is produced by forming the wiring layer in a predetermined pattern followed by thermally pressing the wiring layer into the carrier base. The wiring transfer sheet 300 is the same as the wiring transfer sheet shown in FIG. 1(a) except that the wiring layer 302 is buried in the carrier base 301. The shape of concavities and the interface between the carrier base 301 and the wiring layer 302 are as described above with reference to FIG. 1.

A wiring board 310 as shown in FIG. 3(c) is obtained by transferring the wiring layer of this wiring transfer sheet to a surface of an electrically insulating substrate through heating and pressurization. As shown in FIG. 3(d), in the wiring board 310, the transferred wiring layer 303 protrudes from the surface of the electrically insulating substrate 304. When a semiconductor bare chip or the like is mounted on the surface of the wiring layer 303, the gap between the semiconductor bare chip and the surface of the wiring board is larger compared with the case where the bare chip is mounted on the wiring board shown in Fig. (d). As described above, the larger the gap is, the easier a sealing resin for protecting the mounting is injected. As described above with reference to FIG. 1(f), the surface of the wiring layer 303 has convexities.

(Embodiment 4)

Figure 4:
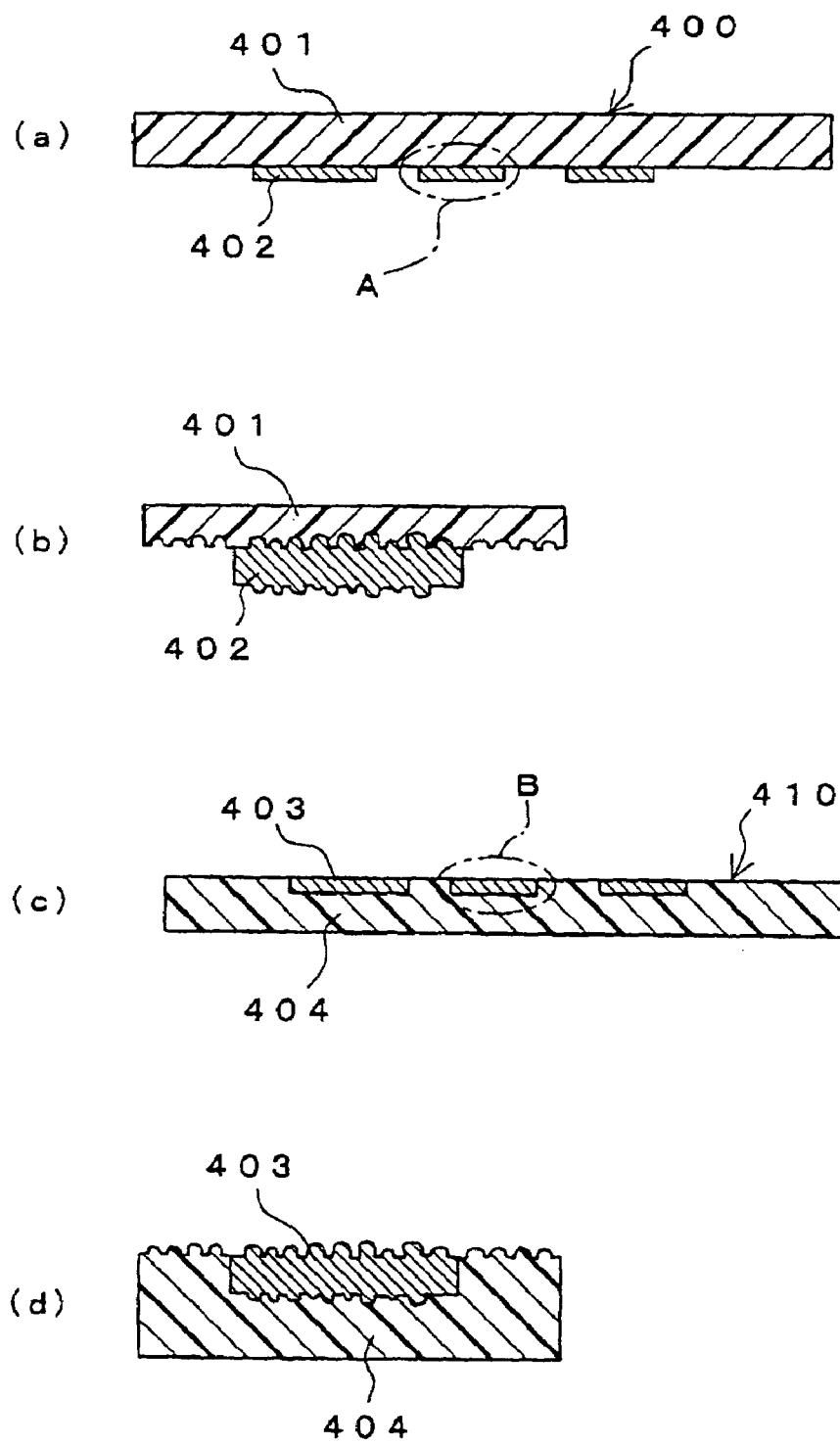
FIG. 4(a) shows a schematic cross-sectional view of a wiring transfer sheet of Embodiment 4 of the present invention.
FIG. 4(b) shows an enlarged cross-sectional view of Area A in the wiring transfer sheet shown in FIG. 4(a)
FIG. 4(c) shows a schematic cross-sectional view of a wiring board wherein a wiring layer is transferred with the wiring transfer sheet shown in FIG. 4(a)
FIG. 4(d) shows an enlarged cross-sectional view of Area B in the wiring board shown in FIG. 4(c)

In FIG. 4, a wiring transfer sheet of another embodiment of the present invention and a wiring board which is produced using the wiring transfer sheet are schematically shown in sectional views. FIG. 4(a) shows a wiring transfer sheet 400 wherein a wiring layer 402 is formed on a surface of a carrier base 401. FIG. 4(b) shows an enlarged view of Area A in the vicinity of the wiring layer of the wiring transfer sheet. FIG. 4(c) shows a wiring board 410 which is obtained by transferring a wiring layer 403 to an electrically insulating substrate 404. FIG. 4(d) shows an enlarged view of Area B in the vicinity of the wiring layer of the wiring board.

As shown in FIG. 4(b), in the wiring transfer sheet 400, the interface between the wiring layer 402 and the carrier base 401 is uneven, while the exposed surface of the wiring layer 402 has convexities. The remaining construction of the wiring transfer sheet 400 is as described with reference to FIG. 1.

The wiring board 410 of the structure as shown in FIG. 4(c) is obtained by transferring the wiring layer of this wiring transfer sheet to a surface of an electrically insulating substrate though heating and pressurization. As shown in FIG. 4(d), in the wiring board 410, the convexities on the exposed surface of the wiring layer 402 of the wiring transfer sheet 400 ensure favorable adhesion between the wiring layer 403 and the electrically insulating substrate 404.

Next, a method for producing a wiring transfer sheet of the present invention is described. As described above, there are first, second and third production methods for producing the wiring transfer sheet of the present invention. In the first production method, a wiring material sheet which has a rough surface is used, and this sheet is pressed against a carrier base so as to make a surface of the carrier sheet another rough surface complementary to the rough surface of the wiring material sheet. Then a wiring layer having a predetermined pattern is formed by patterning the wiring material sheet.

The wiring material sheet whose surface is a rough surface is preferably a sheet whose surface has a plurality of convexities. As one embodiment of the first production method, an embodiment in which such a sheet is used, is described thereinafter.

The wiring material sheet is, for example, a metal foil. The metal foil is preferably formed from a metal exemplified above as a metal which preferably constitutes the wiring layer. The metal originally has a flat surface. In order to make this flat surface a rough surface, it is preferable that metal particles are deposited on a surface of the metal foil through electrolytic plating so as to form a plurality of convexities. As described above, each convexity formed by electrolytic plating has a structure in which the metal particles deposited through electrolytic plating are flocculated and/or piled up. Electrolytic plating is preferably employed as a method for forming the convexities from the viewpoint of productivity.

The size of the metal particles deposited through electrolytic plating (this particle is merely referred to as a "deposited particle") is selected so that the shape of the rough surface (for example, the size of the concavity) which is to be formed on the surface of the carrier base is a desired one. When the size of the deposited particle is small, the concavity formed on the surface of the carrier base is small, so that the size of the convexity formed on the electrically insulating substrate of the wiring board becomes small. As a result, a sufficient anchoring effect is not obtained when a resin is stacked on the surface of the wiring board. When the size of the deposited particle is large, the number of convexities which exist between the wiring layer and the carrier base is small when the wiring layer of fine width (for example, 20 µm or less) is formed by patterning the metal foil. As a result, the adhesion between the wiring layer and the carrier base provided by an anchoring effect of the convexities becomes insufficient, which causes the wiring layer to exfoliate from the carrier base. Specifically, the deposited particle is preferably a round shape having a diameter in the range of 0.1 µm to 4 µm. The convexity preferably has a form wherein a plurality of the deposited particles of this size are flocculated and/or piled up, and as a whole preferably has the above-mentioned size (that is, a diameter of between 1 and 10 µm at the section whose area is largest, and a height of between 0.5 and 5 µm). However, the convexity does not necessarily need to be formed of a plurality of the deposited particles, and may be formed of one deposited particle.

The wiring material layer which has a plurality of convexities is superposed on a carrier base with the convexities in contact with a surface of the carrier base, and then is pressed against the carrier base so as to bury the convexities in the carrier base and to be integrated with the carried base. Therefore, in this production method, it is necessary to use a base which is made from a material into which the convexity on the wiring material sheet can be buried, as the carrier base. Specifically, the carrier base needs to be a sheet of an organic resin, or a laminate wherein a wiring forming layer is made of an organic resin. In that case, an organic resin which is suitable for constituting the carrier base is a heat resistant resin such as a fluorine-containing resin as described above.

When the convexities on the wiring material sheet are buried in the carrier base, the wiring material sheet and the carrier base are integrated by an anchoring effect of the convexities. In order to improve the adhesion between them, a junction layer may be interposed between the wiring material layer and the carrier base. The material suitable for the junction layer is as described above. The junction layer is formed by, for example, plating the surface of the wiring material sheet on which the convexities are formed. For example, when a Cr or a Ni layer is formed by plating, it passivates in the atmospheric air which results in improved adhesion. The junction layer may be formed on a surface of the carrier base.

Before superposing the wiring material sheet, a surface of the carrier base is subjected to a releasing treatment. The purpose and method of the releasing treatment are described in relation to the carrier base, the description thereof being omitted here. The releasing treatment is preferably conducted when the carrier base is made of an epoxy resin. The releasing treatment is not required when the carrier base is made from a material which exhibits an excellent releaseability as to the electrically insulating substrate itself (e.g. a fluorine-containing resin).

The integration of the wiring material sheet with the carrier base is carried out by superposing the wiring material sheet on the carrier base followed by heating and pressurization so as to make close contact therebetween. The heating and pressurization are carried out under the condition that the carrier base is softened so as to deform due to the convexities on the wiring material sheet, and the carrier base does not deteriorate. When the carrier base is made of a thermoplastic resin, the heating and pressurization are conducted under the condition that the carrier base is softened. When the carrier base is made of a thermosetting resin, the thermosetting resin is in an uncured or a semi-cured state in the carrier base before heating and pressurization, and the heating and pressurization are carried out so that the thermosetting resin is softened and the viscosity of the resin is reduced. Thus, concavities complementary to the convexities are formed, and then the resin is cured. Further, the heating and pressurization are carried out in an inert gas atmosphere or a vacuum atmosphere, if necessary, so that the wiring material sheet is not oxidized.

After integrating the wiring material sheet with the carrier base, a wiring layer having a predetermined wiring pattern is formed by etching the wiring material. Thereby, the wiring transfer sheet is obtained. Etching is carried out through a conventional technique with an appropriate etchant selected depending on the wiring material. Within a region from which the wiring material is removed by etching, the surface of the carrier base is exposed. On the exposed surface of the carrier base, the concavities exist. Further, in the wiring transfer sheet produced by this production method, the interface between the carrier base and the wiring layer is a structure wherein the wiring layer enters the concavities of the carrier base. This structure results from the convexities of the wiring material sheet being buried into the carrier base.

Figure 5:
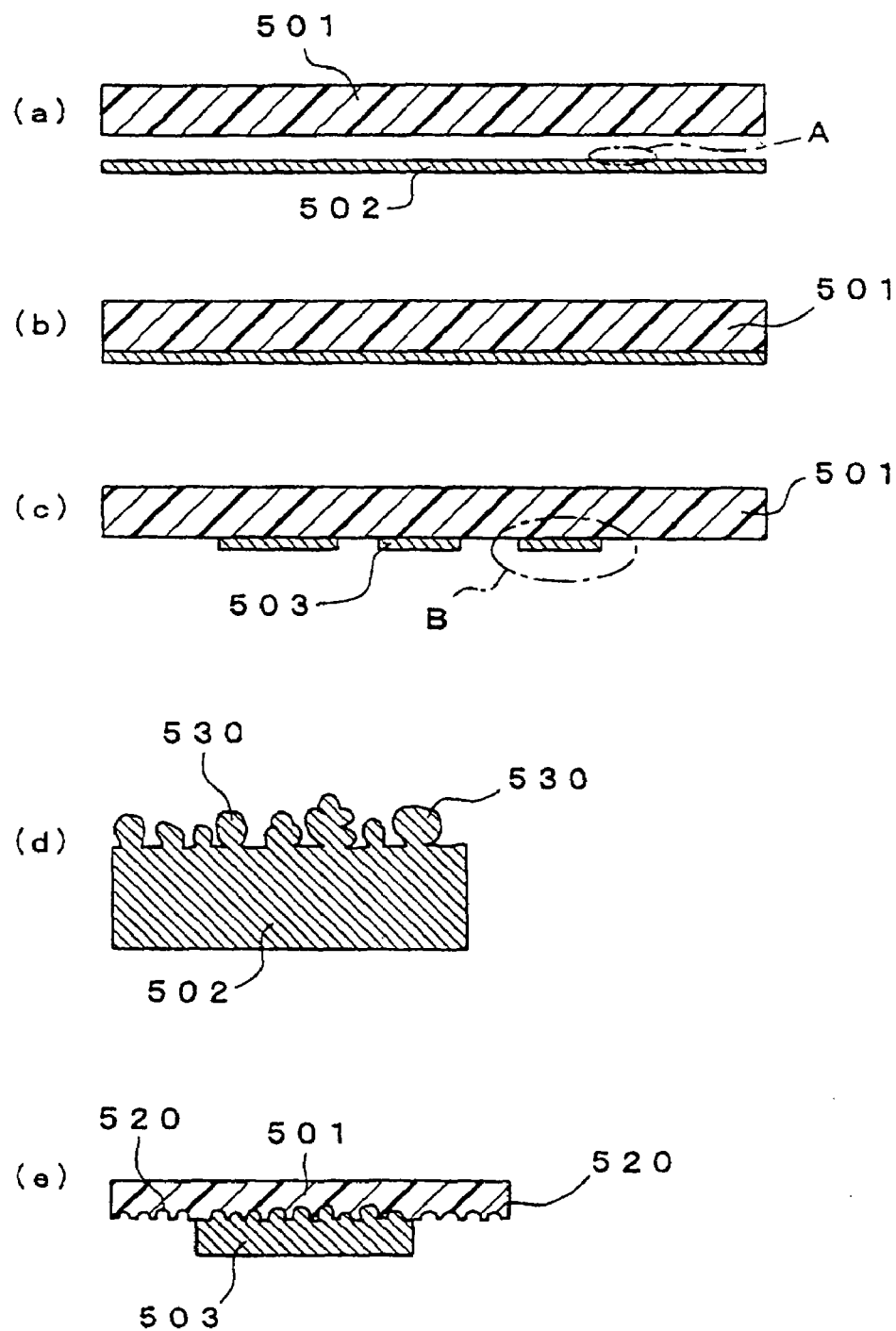
FIGS. 5(a) to 5(c) show schematic cross-sectional views illustrating the steps in an embodiment of a first method for producing a wiring transfer sheet of the present invention.
FIG. 5(d) shows an enlarged cross-sectional sectional view of Area A shown in FIG. 5(a)
FIG. 5(e) shows an enlarged cross-sectional sectional view of Area B shown in FIG. 5(b)

In FIGS. 5(a) to 5(c), the major steps of the first method for producing a wiring transfer sheet of the present invention are shown. In FIG. 5(a), a carrier base 501 and a wiring material sheet 502 are show, respectively. In FIG. 5(d), an enlarged view of Area A of a surface of wiring material sheet. As shown in FIG. 5(d), on the entire surface of the wiring material sheet, bump-shaped, mushroom-shaped, or bud-shaped convexities 530 are formed. The junction layer (not shown) may be previously formed on the surface of the carrier base 501 or the wiring material sheet 502. Further, the surface of the carrier base 501 may be previously subjected to a releasing treatment.

FIG. 5(b) shows a step of superposing the carrier base 501 on the wiring material sheet 502 followed by heating and pressurization so that the carrier base adheres to the wiring material, and thereby the convexities are buried in the carrier base. By burying the convexities, concavities complementary to the convexities are formed on a surface of the carrier base.

FIG. 5(c) shows a step of etching the wiring material sheet 502 so as to form a wiring layer 503 in a predetermined wiring pattern. FIG. 5(e) shows an enlarged view of Area B in the vicinity of the wiring layer. As shown in FIG. 5(e), concavities 520 are formed on an exposed surface of the carrier base 501, which results from removal of the wiring material sheet, and the interface between the carrier base 501 and the wiring layer 503 is uneven.

In the above, there is described an embodiment wherein the wiring material sheet which has a plurality of convexities on its surface is used. The surface (rough surface) of the wiring material sheet is not limited to one which has a plurality of convexities. For example, the surface of the wiring material sheet may be a rough surface which has a plurality of concavities. Further, it is advantageous that the carrier base 501 is a two-layer structure which has a sheet of an organic resin and a copper foil, in terms of dimensional stability and handling property.

Next, the second method for producing a wiring transfer sheet of the present invention is described. In the second production method, a wiring layer with a predetermined pattern is formed on a surface of a carrier base, and then the exposed surface of the carrier base is made a rough surface by subjecting it to a roughening treatment. The roughening treatment is preferably carried out so that a plurality of concavities are formed. Thereinafter, as one embodiment of the second production method, an embodiment in which the roughening treatment is carried out so that a plurality of concavities are formed, is described.

This production method is preferably employed when a carrier base is made from a material which does not deform by heating and pressurization, such as a metal foil. This is because, when another sheet (that is, the wiring material sheet) with convexities is superposed on and integrated with such a carrier base according to the first production method, it is difficult to form concavities complementary to the convexities on the carrier base. This production method is preferably employed when the carrier base is an aluminum foil, a stainless foil, or the like.

In the case where the carrier base is a metal foil such as an aluminum foil, the wiring layer is formed by depositing a wiring material such as copper through electrolytic plating followed by patterning. In that case, a surface of the metal foil is preferably flat so that a uniform layer is formed through electrolytic plating.

With some kinds of metal foils, it is difficult to deposit directly on the surface of the metal foil by plating. In that case, the wiring material may be plated on a junction layer which has been previously formed on the surface of the carrier base, whereby good adhesion between the carrier base and the wiring layer can be ensured. For example, when the carrier base is an aluminum foil and the wiring layer is made of copper, a zinc layer is preferably formed on the surface of the aluminum foil as the junction layer through electrolytic plating. In that case, copper is deposited on the surface of the zinc layer through electrolytic plating.

The wiring material layer deposited on the surface of the carrier base is patterned by etching so that the wiring layer with a predetermined pattern is formed. When both the carrier base and the wiring layer are made of metals, a combination of the carrier base and the wiring layer is selected so that only the metal constituting the wiring layer is etched, or an etching rate of the metal constituting the carrier base is lower than that of the metal constituting the wiring layer. When the carrier base and the wiring layer is made of metals of the same kind, it is preferable that an interlayer is formed between the carrier base and the wiring layer as an etching stopper layer, and therefore the wiring layer is formed on the surface of the interlayer. A material constituting the interlayer is optimally selected depending on the combination of the carrier base and the wiring layer, and the kind of etchant. Generally, the material is selected from chromium, nickel, cobalt, titanium, and zinc. For example, when the combination of a carrier base of copper and a wiring layer of copper is employed and a sulfuric acid-based etchant is used, the interlayer is preferably made of aluminum, titanium, or chromium. When an aqueous solution of ferric chloride or cupric chloride is used as an etchant for this combination, the interlayer is preferably made of titanium or stainless. These interlayers also serve as an etching stopper layer when the carrier base is removed by etching after the wiring has been transferred to an electrically insulating substrate. When the carrier base is a stainless foil or an aluminum foil and the wiring layer is made of copper, such an interlayer is generally unnecessary.

After etching the wiring material, the surface of the carrier base is exposed within an area from which the wiring material is removed by etching. The exposed surface of the carrier base is subjected to the roughening treatment so that a plurality of concavities are formed. As a method of the roughening treatment, a dry-etching with a reactive gas, a machining with sandblast, and an electrolytic etching can be employed. When the carrier base is an aluminum foil, fine pit-shaped concavities can be formed by electrolytic etching with a hydrochloric acid-based etchant. When carrying out the roughening treatment, an etching resist that has been used for forming the wiring layer, is preferably left on the wiring layer. The reason for this is that the wiring layer is protected by the etching resist so that it is not damaged during the roughening treatment. In the case where the roughening treatment is conducted in this manner, the etching resist is removed after the roughening treatment.

Figure 6:
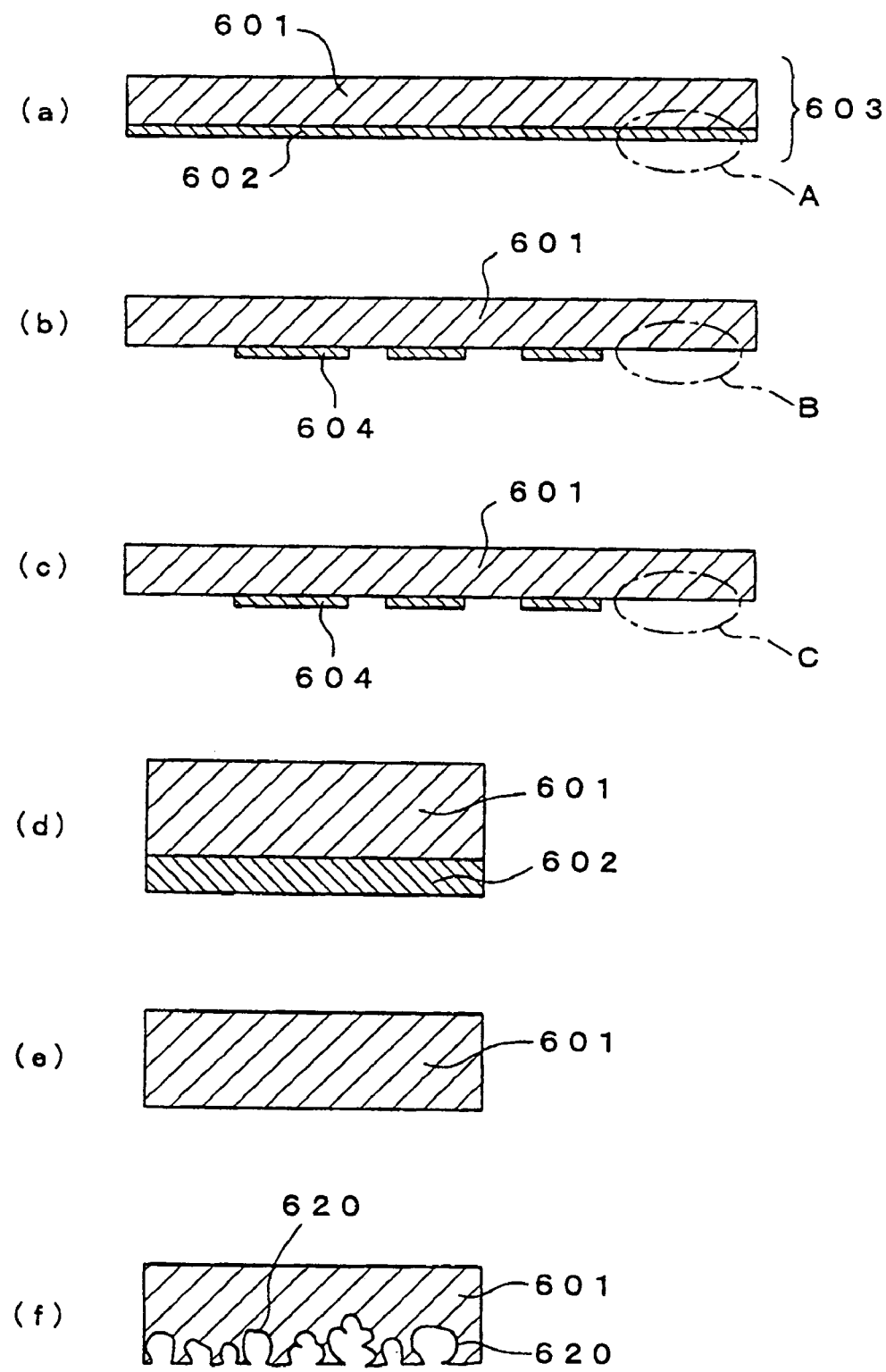
FIGS. 6(a) to 6(c) show schematic cross-sectional views illustrating the steps in an embodiment of a second method for producing a wiring transfer sheet of the present invention.
FIG. 6(d) shows an enlarged cross-sectional view of Area A shown in FIG. 6(a)
FIG. 6(e) shows an enlarged cross-sectional view of Area B shown in FIG. 6(b)
FIG. 6(f) is an enlarged cross-sectional view of Area C shown in FIG. 6(c)

FIGS. 6(*a*) to 6(*c*) show the major steps of the second method for producing a wiring transfer sheet of the present invention. FIG. 6(*a*) shows the step of superposing a layer 602 of a wiring material on a surface of a carrier base 601 which is a metal foil. An enlarged view of the interface (Area A) in the composite 603 obtained in FIG. 6(*a*) is shown in FIG. 6(*d*). In the illustrated embodiment, the interface is flat since the wiring material such as copper is laminated on the metal foil through electrolytic plating. The composite in which a layer of wiring material is formed on a metal foil is commercially available. For example, a composite in which a copper layer is formed on a surface of an aluminum foil is commercially available under the trade name "UTC copper foil" from Mitsui Mining & Smelting Co., Ltd. In the production method of the present invention, such a commercially available composite may be used for carrying out the following steps.

FIG. 6(*b*) shows a step of forming a wiring layer 604 by patterning the wiring material layer 602 through etching. As described above, etching is carried out so that only a part of the wiring material layer 602 is removed. FIG. 6(*e*) shows an enlarged view of an exposed surface of the carrier base (Area B) after the step of FIG. 6(*b*) has been conducted. As shown, at this stage, the exposed surface of the carrier base 601 is flat.

FIG. 6(*c*) shows a step of subjecting the exposed surface of the carrier base 601 to a roughening treatment after the step of FIG. 6(*b*) has been conducted. FIG. 6(*f*) shows an enlarged view of the exposed surface of the carrier base (Area C) after the roughening treatment has been conducted. As shown, a plurality of concavities 620 are formed on the exposed surface of the carrier base. The roughening treatment is conducted so that a predetermined number of concavities with predetermined shapes are obtained depending on the shapes and so on of convexities to be formed on an object, that is, an electrically insulating substrate.

This second method for producing a wiring transfer sheet is employed not only when the carrier base is a metal foil, but also when it is made of a resin. When the carrier base is a sheet of resin, a layer or a wiring material is formed on the carrier base by electroless plating, a method in which electroless plating and electrolytic plating are combined, or vacuum film forming followed by etching the layer of wiring material so as to form a wiring layer of a predetermined pattern.

In the above, the embodiment in which the roughening treatment is carried out so that a plurality of concavities are formed, is described. The roughening treatment is not limited to one in which the concavities are formed on the exposed surface of the carrier base. For example, the roughening treatment may be conducted so that a plurality of convexities are formed on the exposed surface of the carrier base.

Next, the third method for producing a wiring transfer sheet of the present invention is described. In the third production method, a surface of a carrier base is made a rough surface, and then a metal is deposited on the rough surface in a predetermined pattern by plating, whereby a wiring layer is formed. The surface of the carrier base is preferably made a rough surface which has a plurality of concavities. Thereinafter, as one embodiment of the third production method, an embodiment in which a plurality of concavities are formed on a surface of a carrier base, and then a wiring layer is formed, is described.

The method for forming concavities on a surface of the carrier base is as described in relation to the second production method. When the carrier base is made of a resin, the concavities may be formed by pressing concavities into the carrier base using a roller or a metallic die which has convexities or a metal foil which has convexities formed by electrolytic plating, or may be formed by machining. When the carrier base is made of a supporting layer and a wiring-forming layer that is made of a resin, the concavities may be formed in the same manner. The convexities formed on the roller, the metallic die or the like preferably have shapes that are to be formed on the object. The convexities on the roller and so on are pressed (or transferred) so as to form the concavities on the carrier base, and other convexities complementary to the concavities of the carrier base are formed on the object. In other words, the shapes of the concavities on the roller and so on can control a surface shape of a wiring board.

Next, a photoresist is formed on the surface of the carrier base where the concavities are formed, and then it is subjected to patterning. For example, the photoresist is formed by laminating a dry film type material. The patterning is carried out so that openings resulting from the patterning form a predetermined wiring pattern. Next, a metal is deposited in the openings through plating, whereby a wiring layer is formed. When the carrier base is made of a metal, the deposition of metal is preferably carried out by electrolytic plating from the viewpoint of productivity. When the carrier base is made of a resin, a metal can be deposited by electroless plating. The metal deposited through plating is generally copper. Since the metal deposited through plating enters the concavities on the carrier base, the interface between the carrier base and the wiring layer become uneven in a wiring transfer sheet obtained by this method. Next, the wiring pattern in the predetermined pattern is formed by removing the photoresist, whereby the wiring transfer sheet is obtained.

Figure 7:
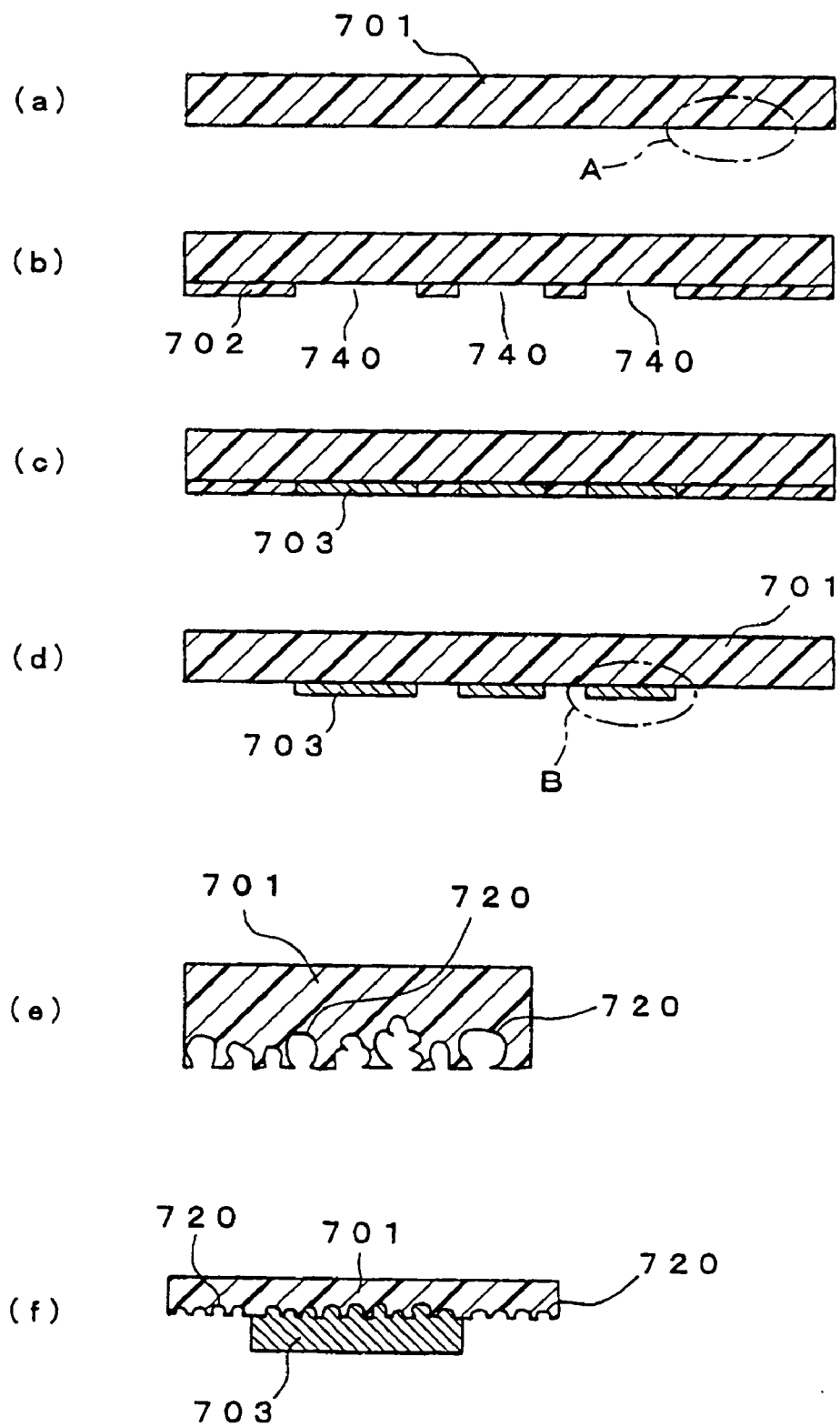
FIGS. 7(a) to 7(d) show schematic cross-sectional views illustrating the steps in an embodiment of a third method for producing a wiring transfer sheet of the present invention.
FIG. 7(e) shows an enlarged cross-sectional view of Area A shown in FIG. 7(a)
FIG. 7(f) shows an enlarged cross-sectional view of Area B shown in FIG. 7(d)

FIGS. 7(a) to 7(d) show major steps of the third method for producing a wiring transfer sheet of the present invention. FIG. 7(a) shows a step of forming concavities 720 on a surface of a carrier base 701. FIG. 7(e) shows an enlarged view of the surface of the carrier base 701 (Area A). As shown, in the carrier base 701, a number of bump-shaped, mushroom-shaped or bud-shaped concavities are formed.

FIG. 7(b) shows the step of forming a photoresist 702 on the surface of the carrier base 701 and subjecting the photoresist 702 to patterning. By patterning, openings 740 in which a wiring layer is to be formed are formed in the photoresist 702. FIG. 7(c) shows the step of depositing the wiring material 703 in the openings 740 in the photoresist 702 by plating. FIG. 7(d) shows the step of removing the photoresist so as to form a wiring layer 703. FIG. 7(e) shows an enlarged view of Area B in the vicinity of the wiring layer in the wiring transfer sheet obtained by carrying out the step of FIG. 7(d). As shown, the concavities 720 exist on the exposed surface of the carrier base. The interface between the carrier base 701 and the wiring layer 703 is uneven so that the carrier base and the wiring layer closely adhere to each other. Therefore, in the wiring transfer sheet of this construction, the adhesion between the carrier base and the wiring layer is good.

In the above, the embodiment wherein a surface of the carrier base is made a rough surface by forming a plurality of concavities is described. The surface of the carrier base (the rough surface) is not limited to one having a plurality of concavities. For example, the surface of the carrier base can be made a rough surface by processing the surface so that is has a plurality of convexities.

In the above, the specific embodiments of the wiring transfer sheets of the present invention and methods for producing them have been described. Next, a method for producing a wiring board using the wiring transfer sheet of the present invention is described.

The wiring board of the present invention is one wherein a wiring layer is formed by transferring a wiring layer of a wiring transfer sheet of the present invention, and at least an exposed area of a surface of an electrically insulating substrate is a rough surface (the rough surface of the electrically insulating substrate constituting a portion of a surface of the wiring board, which surface has the wiring layer). The rough surface preferably has a plurality of convexities. The electrically insulating substrate on which the wiring layer is to be transferred is as described above, and contains, for example, a thermosetting resin or a thermoplastic resin.

As described above, there are first and second methods for producing the wiring board of the present invention. In the first production method, the step of forming at least one of the wiring layers which are disposed on both surfaces of an electrically insulating substrates includes (1) the step of superposing a wiring transfer sheet of the present invention on a surface of an electrically insulating substrate, (2) the step of transferring a wiring layer of the wiring transfer sheet to an electrically insulating substrate, and roughening the surface of the electrically insulating substrate so that the surface has a shape complementary to a rough surface of a carrier base of the wiring transfer sheet, and (3) the step of removing the carrier base of the wiring transfer sheet.

The wiring transfer sheet of the present invention is superposed on at least one of the surfaces of an electrically insulating substrate. In the production method of the present invention, an electrically insulating substrate having through holes filled with a conductive paste is used. Upon superposing the wiring transfer sheet, it is necessary align the wiring layer to be transferred and the through holes filled with the conductive paste so that a predetermined connection is obtained through the electrically insulating substrate between the wiring layers disposed on both surfaces of the electrically insulating substrate. When the carrier base of the wiring transfer sheet is made from a material through which a visible ray can pass, the wiring layer of the wiring transfer sheet and the through holes of the electrically insulating substrate are employed as alignment markers. These alignment markers are recognized with one recognition system (e.g. a camera) from the upper side of the carrier base (that is, the opposite side to the surface where the wiring layer is formed), whereby the alignment superposing is carried out. The alignment markers recognition system may be one which uses an X-ray.

In the case where the electrically insulating substrate contains an uncured thermosetting resin, the thermosetting resin is in an uncured or a semi-cured state at the stage of superposing the wiring transfer sheet to the electrically insulating substrate. This is for ensuring that convexities complementary to the concavities formed on the wiring transfer sheet are formed on the surface of the electrically insulating substrate and ensuring the adhesion between the electrically insulating substrate and another wiring board or another wiring board intermediate when the electrically insulating substrate is superposed on and integrated with the other wiring board or the other intermediate of wiring board.

After superposing the wiring transfer sheet on the surface of the electrically insulating substrate, by heating and pressurization, the wiring layer is transferred while the surface of the electrically insulating substrate which contacts the exposed surface of the carrier base of the wiring transfer sheet is made a rough surface which is complementary to the exposed surface (i.e. the rough surface) of the carrier base. When a plurality of convexities are formed on the exposed surface of the carrier base, convexities complementary to the concavities are formed on the surface of the electrically insulating substrate. The concavities are formed by a resin contained in the electrically insulating substrate. Specifically, a thermosetting resin contained in the electrically insulating substrate is transformed to a state in which its viscosity is lowered by heating and pressurization and enters the concavities in the carrier base followed by being thermoset, whereby the convexities are formed. Further, this heating and pressurization compress the conductive paste within the through holes, whereby the wiring layer to be transferred is electrically connected to a wiring layer which is opposing through the electrically insulating substrate. The condition of heating and pressurization are selected appropriately depending on the kind of electrically insulating substrate and the wiring pattern and so on. Generally, heating and pressurization are carried out by employing a temperature of between 150 and 250° C. and a pressure of between 1.96 and 19.6 MPa (between 20 and 200 kgf/cm$^2$).

It is necessary to carry out heating and pressurization in such a manner that the carrier base of the wiring transfer sheet is not compatible with the electrically insulating substrate. For example, when heating and pressurization are conducted so that the carrier base made of a thermoplastic resin is softened, the resin constituting the electrically insulating substrate and the resin constituting the carrier base are mixed with each other, resulting in failure to form the convexities complementary to the concavities of the carrier base, on the electrically insulating substrate.

After transferring the wiring layer, the carrier base of the wiring transfer sheet is removed. The removal of the carrier base is conducted by an appropriate method depending on the material of the carrier base. As mentioned above, in the case where the carrier base is made of a metal which can be removed by selective etching, the carrier base is preferably removed by etching. When the carrier base is made of a resin, it is mechanically peeled off.

Further, in the first production method, the electrically insulating substrate may be superposed on a wiring board or a wiring board intermediate which has already been produced, followed by being adhered to the wiring board or the wiring board intermediate upon heating and pressurization, so that a multilayer wring board is obtained. The wiring board or the wiring board intermediate to which the electrically insulating substrate is adhered may be any one, and does not necessarily need to be one wherein a wiring layer is formed by transfer. The electrically insulating substrate may be superposed on a double-faced wiring board or a multilayer wiring board whose wiring layer is formed by a method other than transfer. Alternatively, the electrically insulating substrate may be superposed on an intermediate double-faced wiring board or multilayer wiring board in which one or more electrically insulating substrates contain an uncured thermosetting resin. In the case where the electrically insulating substrate is superposed on an intermediate wiring board containing an uncured thermosetting resin, the uncured thermosetting resin contained in the intermediate wiring board is also preferably post-cured in the step of transferring the wiring layer.

In the above production method, a multilayer wiring board in which two or more wiring layers are formed with the wiring transfer sheet of the present invention can be obtained by repeating the steps (1) to (3). In that case, since an exposed surface of the electrically insulating substrate on which the next electrically insulating substrate is superposed is made a rough surface (for example, a surface having a plurality of convexities), it adhere to the next electrically insulating substrate well. Further, when the exposed surface of the wiring layer is made a rough surface, the adhesiveness of the electrically insulating substrate to the next electrically insulating substrates superposed thereon is more improved.

In the case where the steps (1) to (3) are repeated using an electrically insulating substrate containing a thermosetting resin, it is preferable that in each step (2), heating and pressurization are conducted under the condition that the thermosetting resin contained in the electrically insulating substrate is pre-cured (that is, the thermosetting resin is cured but not cured completely after its viscosity has been lowered once). In the final step (2), heating and pressurization are carried out under the condition that the thermosetting resin contained in all the electrically insulating substrates is post-cured. In other words, the repeated steps (2) except for the final one are carried out under the condition that a) the wiring layer of the wiring transfer sheet is temporarily adhered to the electrically insulating substrate; b) the surface of the electrically insulating substrate is made a rough surface whose shape is complementary to the surface shape of the wiring transfer sheet; and c) the electrically insulating substrate is temporarily adhered to another electrically insulating substrate which is located beneath the electrically insulating substrate. Such a condition is more moderate than that of post-curing the thermosetting resin, and is appropriately selected depending on the kind of thermosetting resin contained in the electrically insulating substrate and the wiring pattern and so on. Generally, each step (2) (except for the final one) is repeated employing a temperature of between 50 and 100° C. and a pressure of between 0.98 and 4.9 MPa (between 10 and 50 kgf/cm$^2$).

In the final step (2), heating and pressurization are conducted under the condition that the thermosetting resin contained in all the electrically insulating substrates is post-cured together. The condition is selected depending on the number of electrically insulating substrates which have been superposed, and the degree of curing of the thermosetting resin contained in each electrically insulating substrate. Generally, in the final step (2), heating and pressurization are conducted employing a temperature of between 150 and 250° C. and a pressure of between 1.96 and 19.6 MPa (between 20 and 200 kgf/cm$^2$).

In the case where the post-curing is conducted after the repetition of temporary adhesion, the electrically insulating substrates are preferably superposed on both surfaces of the wiring board or the wiring board intermediate at the same time, that is, they are superposed symmetrically. Of course, when a multilayer wiring board is produced by repeating the steps (1) to (3) while superposing the electrically insulating substrates symmetrically, a circuit design is made so that the wiring board obtained by superposing the electrically insulating substrates symmetrically, forms a circuit as desired.

The method for producing a multilayer board by repeating the steps (1) to (3) may be carried out using an electrically insulating substrate containing a thermoplastic resin. In that case, each step (2) (including the final one) is conducted under the condition that only the electrically insulating substrate which is superposed on a wiring board is softened. However, whether the thermosetting resin or the thermoplastic resin is a matrix component contained in the electrically insulating substrate, it is necessary that the conductive paste is densified sufficiently to ensure a connection between the wiring layers in the wiring board which is finally obtained. Therefore, each step (2) needs to be conducted so that this requirement is satisfied in addition to the transfer of the wiring layer and the adhesion between the layers.

In FIGS. 8(a) to 8(c), the major steps of the first method for producing a wiring board of the present invention are shown. FIG. 8(a) shows steps of superposing a wiring transfer sheet 803 on an electrically insulating substrate 806 which is an object, and superposing the electrically insulating substrate 806 on a wiring board 807.

The wiring transfer sheet 803 has the same construction as that of the wiring transfer sheet 100 shown in FIG. 1. FIG. 8(d) is an enlarged view of Area A in the vicinity of a wiring layer of the wiring transfer sheet 803. As shown, in the wiring transfer sheet 803, concavities 820 are formed on an exposed surface of a carrier base 801, and the interface between the carrier base 801 and the wiring layer 802 is uneven.

The electrically insulating substrate 806 has through holes 804 filled with a conductive paste 805. In the illustrated embodiment, the electrically insulating substrate 806 is a composite containing an uncured thermosetting resin.

In FIG. 8(a), an All Layers IVH structure resin multilayer wiring board is shown as the wiring board 807. The use of the All Layers IVH structure resin multilayer wiring board makes a higher density wiring possible. However, the structure of the wiring board 807 is not limited to this. A glass-epoxy wiring board which is conventionally used may be employed. Alternatively, an intermediate which has the same structure as that of the wiring board 807 and contains an uncured thermosetting resin in a part of or all of the electrically insulating layers, may be used.

In the illustrated embodiment, the carrier base 801 is made from a material through which a visible ray passes (i.e. a transparent material). Therefore, an alignment of the wiring transfer sheet 803 and the electrically insulating substrate 806 is made using a recognition system (not shown) which is disposed above the wiring transfer sheet 803. An alignment of the electrically insulating substrate 806 and the wiring board 807 is made by registering the through holes formed for alignment in the substrate and the board.

FIG. 8(b) shows a step of heating and pressurizing the wiring transfer sheet 803, the electrically insulating substrate 806 and the wiring board 807 in a state in which they are stacked. The step of heating and pressurizing are carried out using, for example, a heating platen press. In this step, the resin component in the electrically insulating substrate 806 flows into the fine concavities 820 on the surface of the wiring transfer sheet 803 and then the resin is post-cured. Upon the post-curing, adhesions between wiring layer 802 and the electrically insulating substrate 806, and between the electrically insulating substrate 806 and the wiring board 807 are made. Further, in this step, the conductive paste 805 within the through holes 804 is compressed, whereby the wiring layer 802 which is transferred from the wiring transfer sheet 803 and the wiring layer 808 on the wiring board 807 are electrically connected. In the case where a wiring board intermediate is employed in place of the wiring board 807, heating and pressurization are preferably conducted under the condition that an uncured thermosetting resin contained in the intermediate is post-cured.

FIG. 8(c) shows a step of removing the carrier base 801 of the wiring transfer sheet 803. As described above, the carrier base 801 is removed by etching or by being mechanically peeled off, depending on the material thereof. FIG. 8(e) shows an enlarged view of Area C in the vicinity of the wiring layer in the wiring board 810 which is obtained after the carrier base has been peeled off. FIG. 8(f) shows an enlarged view of Area B, where a surface of the electrically insulating substrate is exposed on a surface of the wiring board 810. As shown in FIGS. 8(e) and 8(f), in the obtained wiring board, convexities are formed on the surface of the wiring layer 802' as well as the surface of the electrically insulating substrate 806.

Next, in FIGS. 10(a) to (i), the major steps of the method for producing a multilayer wiring board by repeating the step of superposing, the step of heating and pressurization, and the step of removing the carrier base are shown. FIGS. 10(a) to 10(c) are the same as FIGS. 8(a) to 8(c), illustrating steps for obtaining a wiring board 1008, wherein the wiring layer 1002 is transferred to a surface of an electrically insulating substrate 1006 using a wiring transfer sheet 1000, while the electrically insulating substrate 1006 is adhered to a surface of a wiring board 1007, and then a carrier base 1001 is peeled off. In FIG. 10(a), a wiring board intermediate which has the same structure as that of the wiring board 1007, and which contains an uncured thermosetting resin in a part of or all of the electrically insulating layers may be used in place of the wiring board 1007. Alternatively, a wiring board intermediate which has another structure may be used.

FIGS. 10(d) to 10(f) show steps for increasing the number of wiring layers by one, wherein another electrically insulating substrate 1016 is superposed on a surface of this wiring board 1008 and a wiring layer is formed on a surface of the electrically insulating substrate 1016. FIGS. 10(d) to 10(f) are the same as FIGS. 8(a) to 8(c), illustrating steps for obtaining a wiring board 1018, wherein a wiring layer 1012 is transferred to a surface of the electrically insulating substrate 1016 using a wiring transfer sheet 1010 while the electrically insulating substrate 1016 is adhered to a surface of the wiring board 1008, and then a carrier base 1011 is peeled off. In the wiring board thus obtained, convexities (not shown) are formed on the surface of the wiring layer and the electrically insulating substrate as shown in FIGS.

8(*e*) and 8(*f*). The wiring layer 1002 and the wiring layer 1012 are electrically connected by a conductive paste 1015 which is filled in through holes 1014 formed in the electrically insulating substrate 1016.

Figure 10:
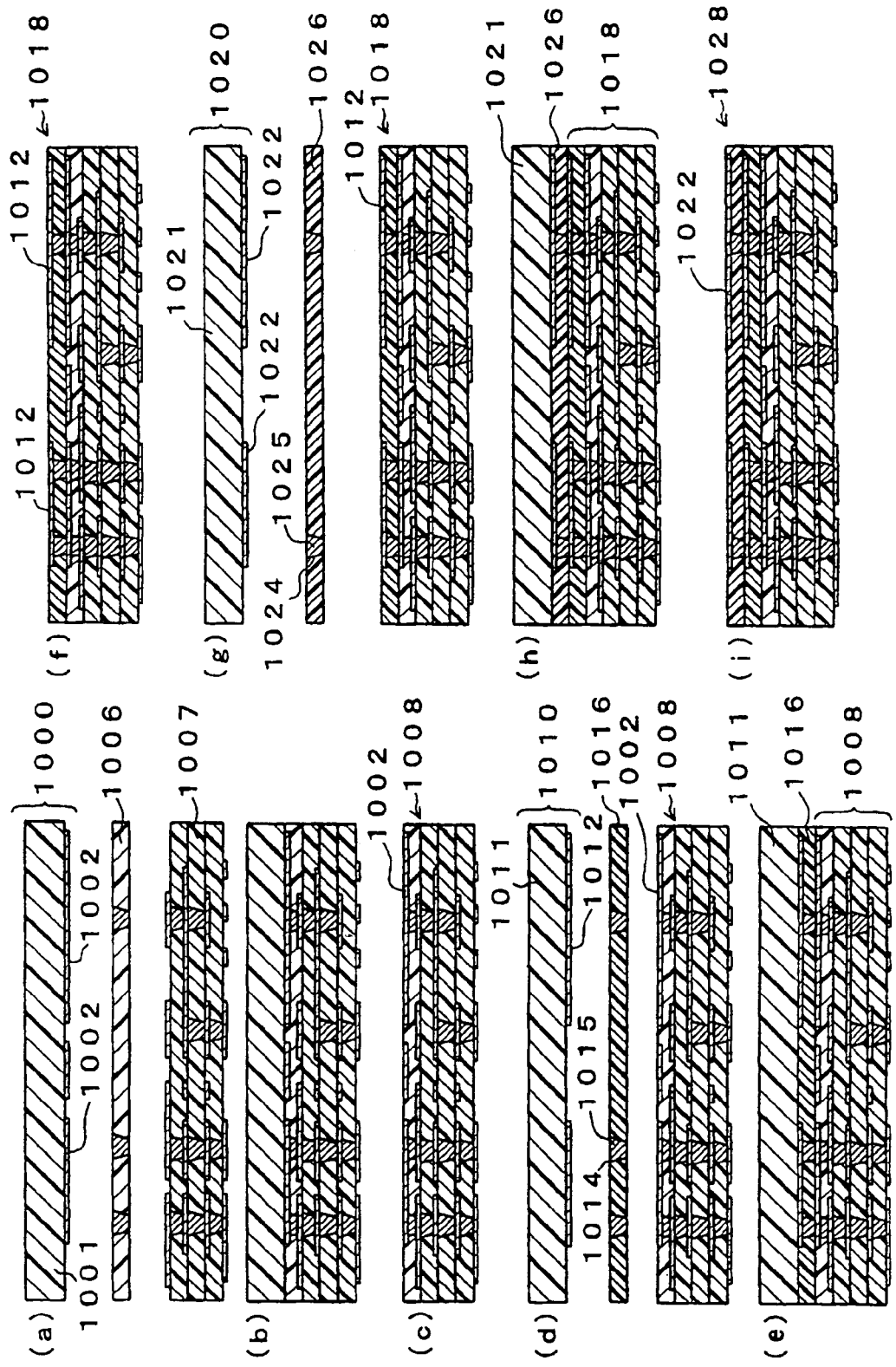
FIGS. 10(a) to 10(i) show schematic cross-sectional views illustrating the steps in another embodiment of the first method for producing a wiring board of the present invention.

FIGS. 10(*g*) to 10(*i*) show steps for increasing the number of wiring layers by one, wherein another electrically insulating substrate 1026 is superposed on a surface of this wiring board 1018 shown in FIG. 10(*f*) and a wiring layer is formed on a surface of the electrically insulating substrate 1026. FIGS. 10(*g*) to 10(*i*) are the same as FIGS. 8(*a*) to 8(*c*), illustrating steps for obtaining a wiring board 1028, wherein a wiring layer 1022 is transferred to a surface of the electrically insulating substrate 1026 using a wiring transfer sheet 1020 while the electrically insulating substrate 1026 is adhered to a surface of the wiring board 1018, and then a carrier base 1021 is peeled off. The wiring layer 1012 and the wiring layer 1022 are electrically connected by a conductive paste 1025 which is filled in through holes 1024 formed in the electrically insulating substrate 1026.

FIG. 10 shows steps wherein three wiring layers are formed using the wiring transfer sheet of the present invention. Of course, more wiring layers may be formed by further repeating the same steps using the wiring transfer sheet of the present invention.

Alternatively, the steps shown in FIGS. 10(*b*) and 10(*e*) may be carried out, respectively, so that the temporary adhesion is made between the wiring layer and the electrically insulating substrate, and between the electrically insulating substrate and the wiring board. The step shown in FIG. 10(*h*) may be carried out so that the thermosetting resin contained in all the electrically insulating substrates 1006, 1016, and 1026 is post-cured to integrate the substrates. In that case, the steps shown in FIGS. 10(*b*) and 10(*e*) do not necessarily need to be carried out using a heating platen press. For pre-curing the thermosetting resin, it suffices that heating and pressurization are conducted in such a manner that the thermosetting resin contained in the electrically insulating substrate is pre-cured. Such heating and pressurization are, for example, thermal lamination. The steps of removing the carrier bases 1001 and 1011 shown in FIGS. 10(*c*) and 10(*f*) are preferably conducted by mechanically peeling off the carrier bases. If these carrier bases are removed by etching, uncured (i.e. not completely cured) thermosetting resin in the electrically insulating substrates 1006 and 1016 may be dissolved because of being exposed to an etchant.

The final step of heating and pressurization, that is the step of FIG. 10(*h*), is carried out under the condition that the thermosetting resin contained in all the electrically insulating substrates 1006, 1016 and 1026 is post-cured while voids which exist between the electrically insulating substrates are eliminated. In the case where a wiring board intermediate is used in place of the wiring board 1007 shown in FIG. 10(*a*), the step of heating and pressurization are carried out so that an uncured thermosetting resin contained in the electrically insulating layer(s) of the intermediate is post-cured. Therefore, the step of FIG. 10(*h*) is preferably conducted using a heating platen press by applying a sufficient pressure over a sufficient time. Further, in the final heating and pressurization step, the conductive paste within the through holes formed in each electrically insulating substrate is compressed into a high density, and thereby each electrical connection between the wiring layers becomes more reliable.

Next, the second method for producing a wiring board of the present invention is described. The second production method includes (1) the step of superposing an electrically insulating substrate on a surface of a wiring transfer sheet which surface has a wiring layer; (2) the step of forming through holes in the electrically insulating substrate; (3) the step of filling the through holes with a conductive paste; (4) the step of superposing the wiring transfer sheet on which the electrically insulating substrate has been superposed, on a wiring board or a wiring board intermediate; (5) the step of heating and pressurization; and (6) the step of removing a carrier base of the wiring transfer sheet.

In the case where the electrically insulating substrate contains an uncured or semi-cured thermosetting resin, the step (1) of superposing the electrically insulating substrate on the wiring transfer sheet is carried out under the condition that the thermosetting resin is pre-cured so that the electrically insulating substrate is temporarily adhered to the wiring transfer sheet. The temporary adhesion is preferably conducted using a roll laminator within a short time so that the curing of the thermosetting resin is not promoted. If the curing of the thermosetting progresses too much, it is difficult to adhere the electrically insulating substrate to the wiring board.

The step (2) of forming the trough holes in the electrically insulating substrate may be carried out by a conventional method, for example a laser processing. The step (3) of filling the through holes with the conductive paste may be carried out by a conventional method, for example, a screen printing of the conductive paste. By carrying out the steps (1) to (3), a laminate wherein the electrically insulating substrate is bonded to the wiring transfer sheet is obtained. The laminate of the wiring transfer sheet and the electrically insulating substrate is more easily handled than only the wiring transfer sheet.

Next, the step (4) of superposing the laminate obtained by carrying out the steps (1) to (3) on a surface of a wiring board or a wiring board intermediate with the electrically insulating substrate in contact with the surface, is carried out. As described above in connection with the first production method, upon this superposing step (4), it is necessary to make an appropriate alignment of the electrically insulating substrate and the wiring board or the wiring board intermediate. In the case where a visible ray passes through a carrier base of the wiring transfer sheet and the electrically insulating substrate, the alignment can be made using a recognition system (for example, a camera) which is disposed on the wiring transfer sheet side. In the case where a visible ray is difficult to pass through the electrically insulating substrate because the substrate contains fibers and so on, it is necessary to previously form through holes for alignment in the electrically insulating substrate of the laminate, and the wiring board or the intermediate wiring layer.

After the wiring transfer sheet with the electrically insulating substrate superposed thereon has been superposed on the wiring board, the step (5) of heating and pressurizing the entire laminate is carried out. As described above in connection with the first production method, heating and pressurization are carried out by setting an appropriate condition depending on the kind of electrically insulating substrate. This heating and pressurization transfers the wiring layer of the wiring transfer sheet to the electrically insulating substrate completely, and makes the surface of the electrically insulating substrate a rough surface whose shape is complementary to a rough surface of the wiring transfer sheet, and adheres the electrically insulating substrate to the wiring board.

After heating and pressurization, the step (6) of removing the carrier base of the wiring transfer sheet is carried out.

The removal of the carrier base is carried out by etching or mechanically peeling off, depending on the material of the carrier base.

The laminate obtained by carrying out the steps (1) to (3) may be laminated on a wiring board intermediate. In that case, in the step (5), heating and pressurization are preferably conducted so that a thermosetting resin contained in the wiring board intermediate is also post-cured.

Also in the second production method, a multilayer wiring board in which two or more wiring layers are formed with the wiring transfer sheet of the present invention can be obtained by repeating the steps (1) to (6). Further, in the case where the steps (1) to (6) are repeated using an electrically insulating substrate containing an uncured thermosetting resin, it is preferable that in each step (5), heating and pressurization are conducted so that the thermosetting resin contained in the electrically insulating substrate is pre-cured, but not cured completely. In the final step (5), heating and pressurization are conducted under the condition that the thermosetting resin contained in all the electrically insulating substrates is post-cured. The condition of the repeated steps (5) (excluding the final one) and the condition of the final step (5) are as described above in connection with the step (2) of the first production method.

In FIGS. 9(a) to 9(f), the major steps of the second method for producing a wiring board of the present invention are shown. FIG. 9(a) shows a wiring transfer sheet 903 of the present invention, and FIG. 9(h) shows an enlarged view of Area A in the vicinity of the wiring layer of the wiring transfer sheet. The wiring transfer sheet shown in FIG. 9(a) is the same as that shown in FIG. 8(a). Therefore, the description as to FIG. 9(h) is omitted since it is the same as FIG. 8(d)

FIG. 9(b) shows the step of obtaining a laminate 909 by superposing an electrically insulating substrate 904 on a surface of the wiring transfer sheet 903, on which surface a wiring layer 902 is formed. In the laminate 909, the electrically insulating substrate 904 is temporarily adhered to the wiring transfer sheet 903. In the illustrated embodiment, the electrically insulating substrate 904 is a composite containing an uncured thermosetting resin.

FIG. 9(c) shows the step of forming through holes 905 in the electrically insulating substrate 904. The method for forming the through holes is as described above.

FIG. 9(d) shows the step of filling the through holes 905 with a conductive paste 906. At a stage where this step has been finished, the electrically insulating substrate is in a state in which it can electrically connect two wiring layers on both surfaces of the substrate.

FIG. 9(e) shows the step of superposing the laminate 909 on a wiring board 907. In FIG. 9(e), an All Layers IVH structure resin multilayer wiring board is shown as the wiring board 907. The wiring board 907 may also be another wiring board. Alternatively, a wiring board intermediate may be used in place of the wiring board 907. The superposing step is carried out so that the wiring layer 902, the through holes 905 and the wiring layer 908 are appropriately aligned.

FIG. 9(f) shows the step of heating and pressurizing the laminate 909 which is superposed on the wiring board 907. In this step, the thermosetting resin contained in the electrically insulating substrate 904 is post-cured, whereby adhesions between the wiring layer 902 and the electrically insulating substrate 904 and between the electrically insulating substrate 904 and the wiring board 907 are made. Further, in this step, the resin component in the electrically insulating substrate 904 flows into the fine concavities 920 on a carrier base 901 completely, and then it is cured. Furthermore, in this step, the conductive paste 906 within the through holes 905 is compressed whereby the wiring layer 902 of the wiring transfer sheet 903 and a wiring layer 908 on the wiring board 907 are electrically connected.

FIG. 9(g) shows the step of removing the carrier base of the wiring transfer sheet 903. In FIG. 9(i), an enlarged view of Area B in the vicinity of a wiring layer in a wiring board 910 thus obtained is shown. As shown in FIG. 9(i), in the obtained wiring board, a wiring layer 902' is buried in the electrically insulating substrate 904. Further, convexities are formed on a surface of the wiring layer 902' as well as a surface of the electrically insulating substrate 904.

Other electrically insulating substrate(s) and other wiring layer(s) may be superposed on the wiring board 910 by repeating the steps shown in FIG. 9(b) to 9(g). In that case, as described above with reference to FIG. 10, it is preferable that the step of FIG. 9(f) is repeated under the condition that the thermosetting resin contained in an electrically insulating substrate is not completely cured (that is, it is pre-cured), and the final step of FIG. 9(f) is carried out under the condition that the uncured thermosetting resin contained in all electrically insulating substrates is post-cured. This makes it possible to realize more precise wiring and correspondence of through holes.

As described above, in the case where the resin is post-cured together after repeating the temporary adhesions (i.e. pre-curing), the electrically insulating substrates are preferably superposed on both surfaces of the wiring board or the wiring board intermediate at the same time, that is, they are superposed symmetrically. Of course, when a multilayer wiring board is produced by repeating the steps (1) to (6) while superposing the electrically insulating substrates symmetrically, a circuit design is made so that the wiring board obtained by superposing the electrically insulating substrates symmetrically forms a circuit as desired.

Figure 8:
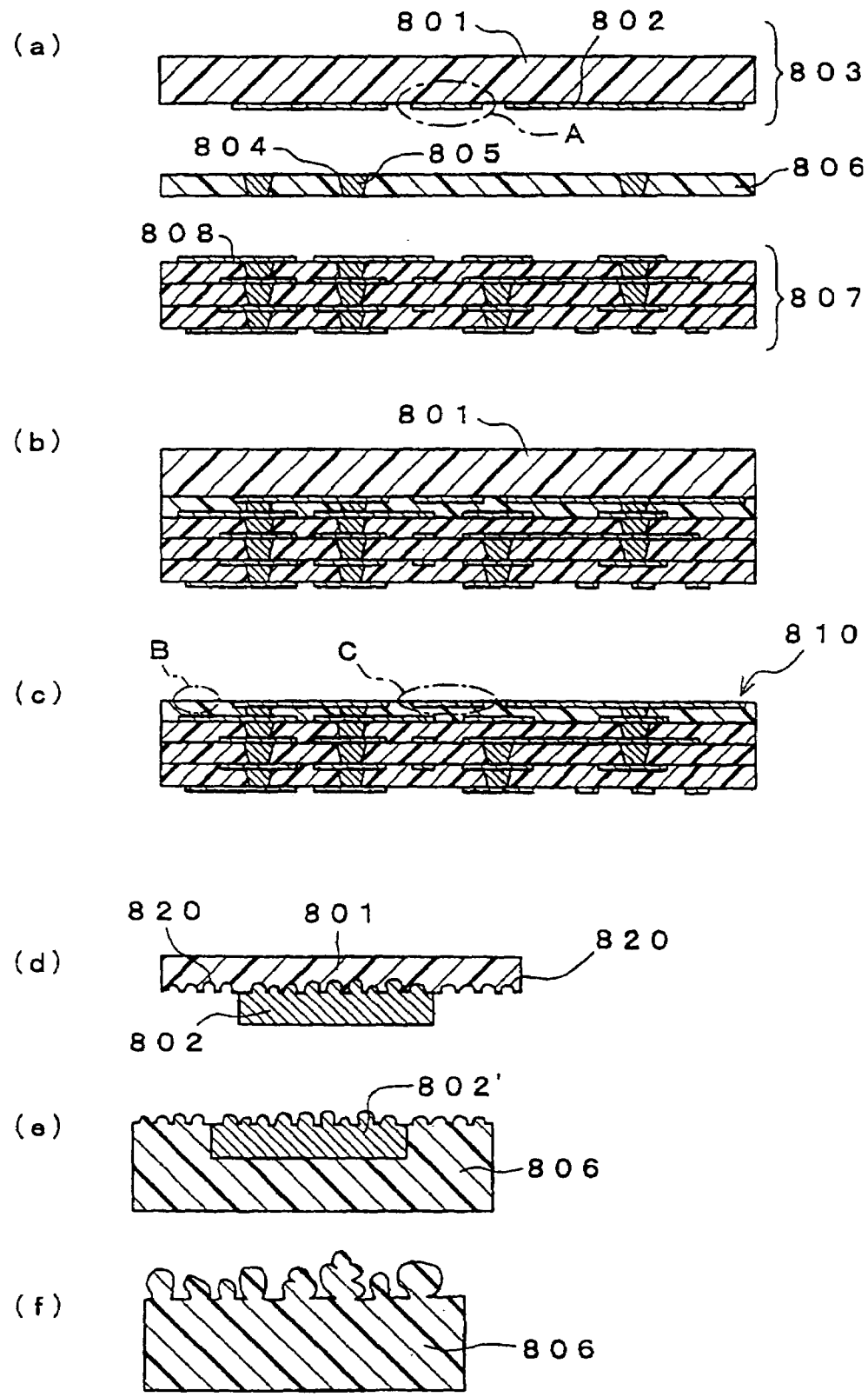
FIGS. 8(a) to 8(c) show schematic cross-sectional views illustrating the steps in an embodiment of a first method for producing a wiring board of the present invention.
FIG. 8(d) shows an enlarged cross-sectional view of Area A shown in FIG. 8(a), and FIGS. 8(e) and 8(f) show enlarged cross-sectional views of Areas C and B shown in FIG. 8(c), respectively.
Figure 9:
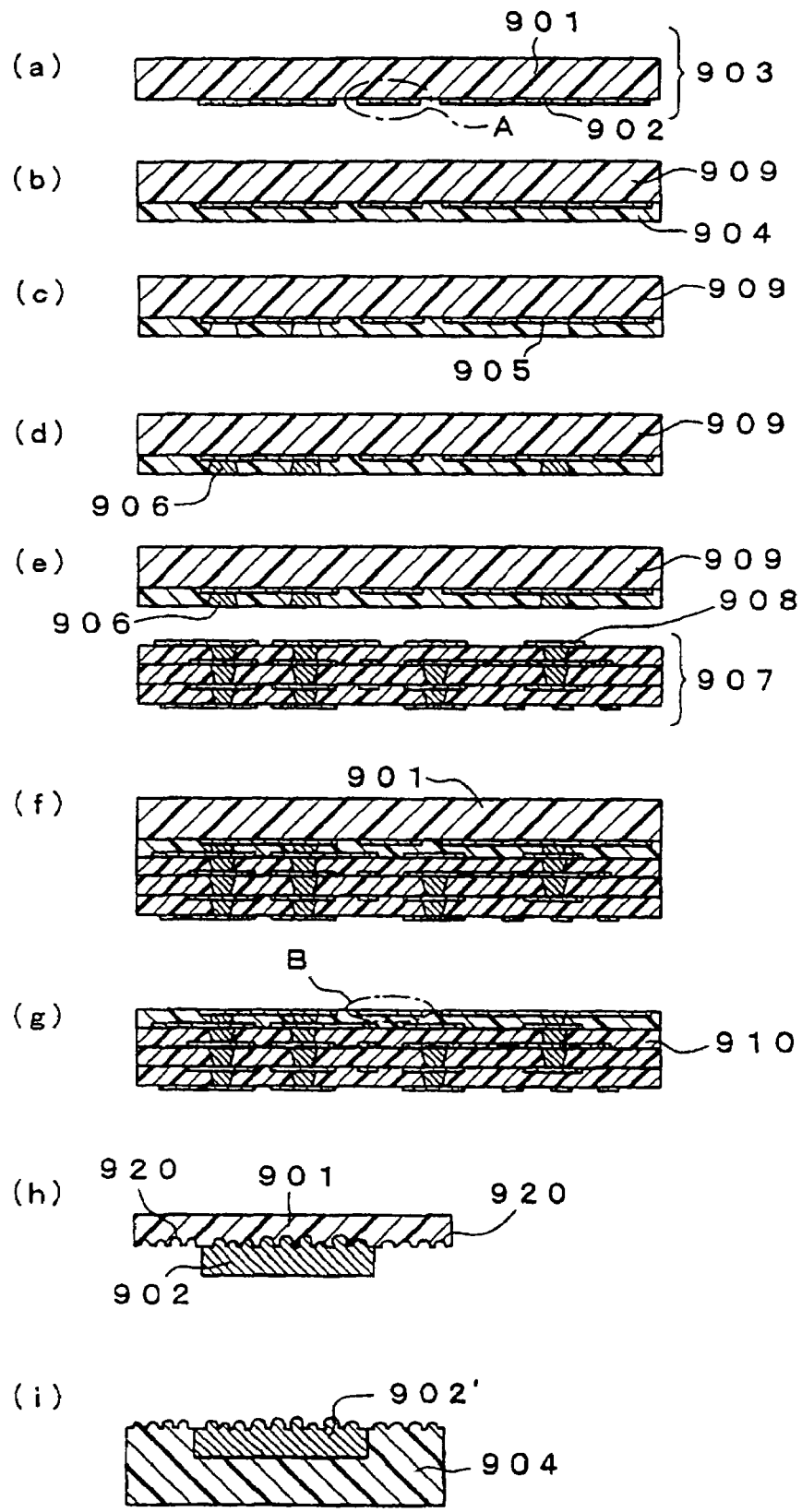
FIGS. 9(a) to 9(g) show schematic cross-sectional views illustrating the steps in an embodiment of a second method for producing a wiring board of the present invention.
FIG. 9(h) shows an enlarged cross-sectional view of Area A shown in FIG. 9(a)
FIG. 9(i) shows an enlarged cross-sectional view of Area B shown in FIG. 9(g)
Figure 16:
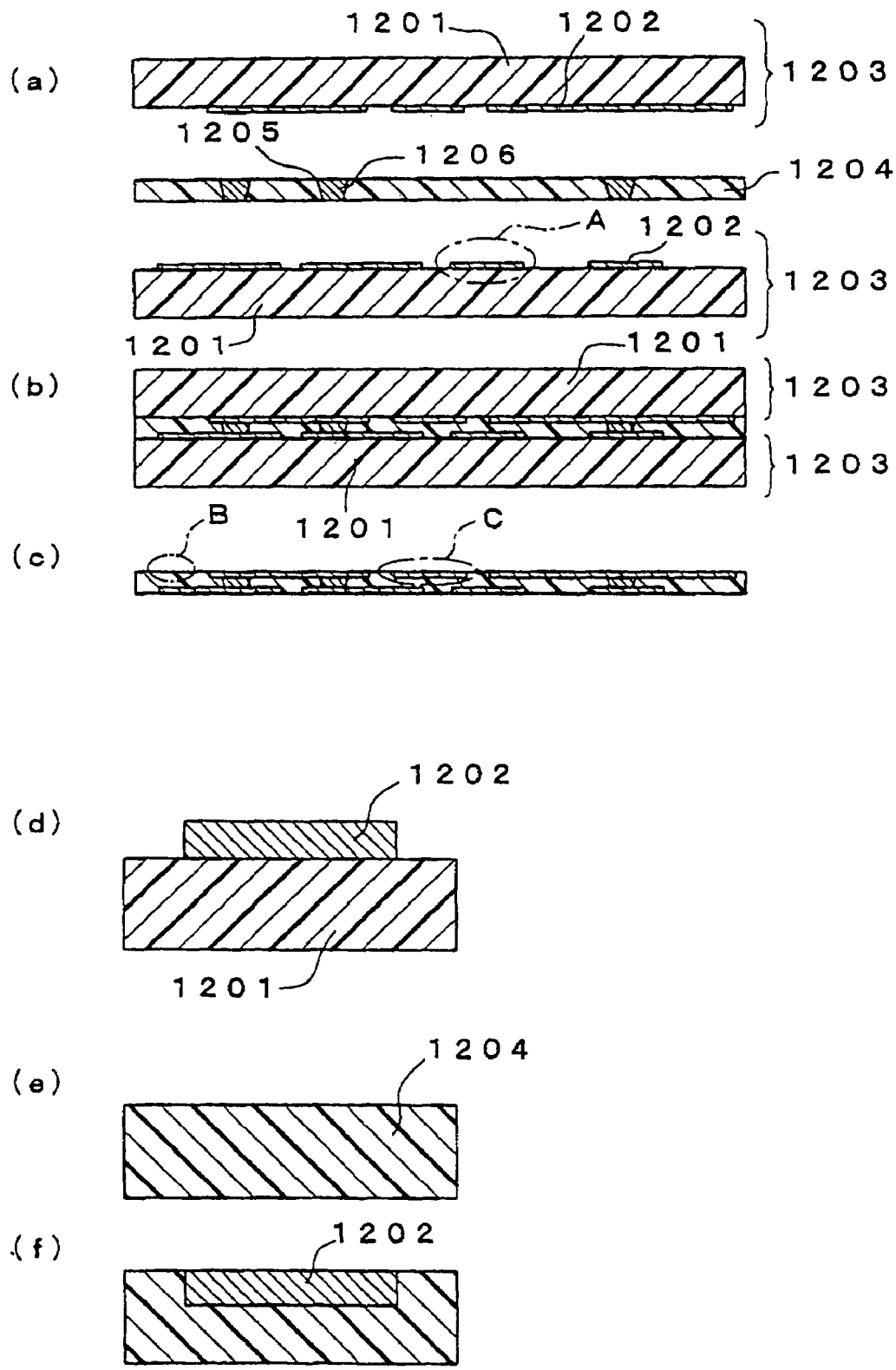
FIGS. 16(a) to 16(c) show cross-sectional views illustrating the steps in a method for producing a wiring board with a conventional wiring transfer sheet.
FIG. 16(d) shows an enlarged cross-sectional view of Area A shown in FIG. 16(a), and FIGS. 16(e) and 16(f) show enlarged cross-sectional views of Areas B and C shown in FIG. 14(c), respectively.

In the production methods shown in FIGS. 8 to 10, a wiring layer is transferred to one surface of an electrically insulating substrate by superposing a wiring transfer sheet of the present invention on the surface of the electrically insulating substrate. The wiring transfer sheets of the present invention may be superposed on both surfaces of an electrically insulating substrate as shown in FIG. 16. In that case, the wiring layers are transferred to both surfaces of the electrically insulating substrate.

As described above, a wiring board with a built-in component can be produced using a wiring transfer sheet of the present invention. Thereinafter, a method for producing it is described with reference to figures.

In FIGS. 11(a) to (l), the major steps of a method for producing a wiring board with a built-in component of the present invention are shown. FIG. 11(a) shows an electrically insulating substrate 1101. In the illustrated method, the electrically insulating substrate 1101 contains a thermosetting resin as a resin component. The illustrated electrically insulating substrate 1101 is obtained by covering both main surfaces thereof with cover films 1102 and then forming through holes 1103 followed by filling them with a conductive paste 1104. The cover films 1102 serve as a mask upon filling the through holes 1103 with the conductive paste and serve to protect the surface of the electrically insulating substrate so that the conductive paste is not adhered thereto.

FIG. 11(b) shows the step of removing the cover films 1102 and then superposing wiring transfer sheets 1100 on both surfaces of the electrically insulating substrate 1101. This wiring transfer sheet 1100 is one of the present invention, and is comprised of a carrier base 1105 and a wiring layer 1106 that is formed in a desired wiring pattern on a surface of the carrier base. Therefore, the wiring layer 1106 is preferably formed of a copper foil in which both surfaces are roughened. Therefore, it is ensured that the wiring layer adheres well to electrically insulating substrates on both surfaces of the wiring layer.

Figure 11:
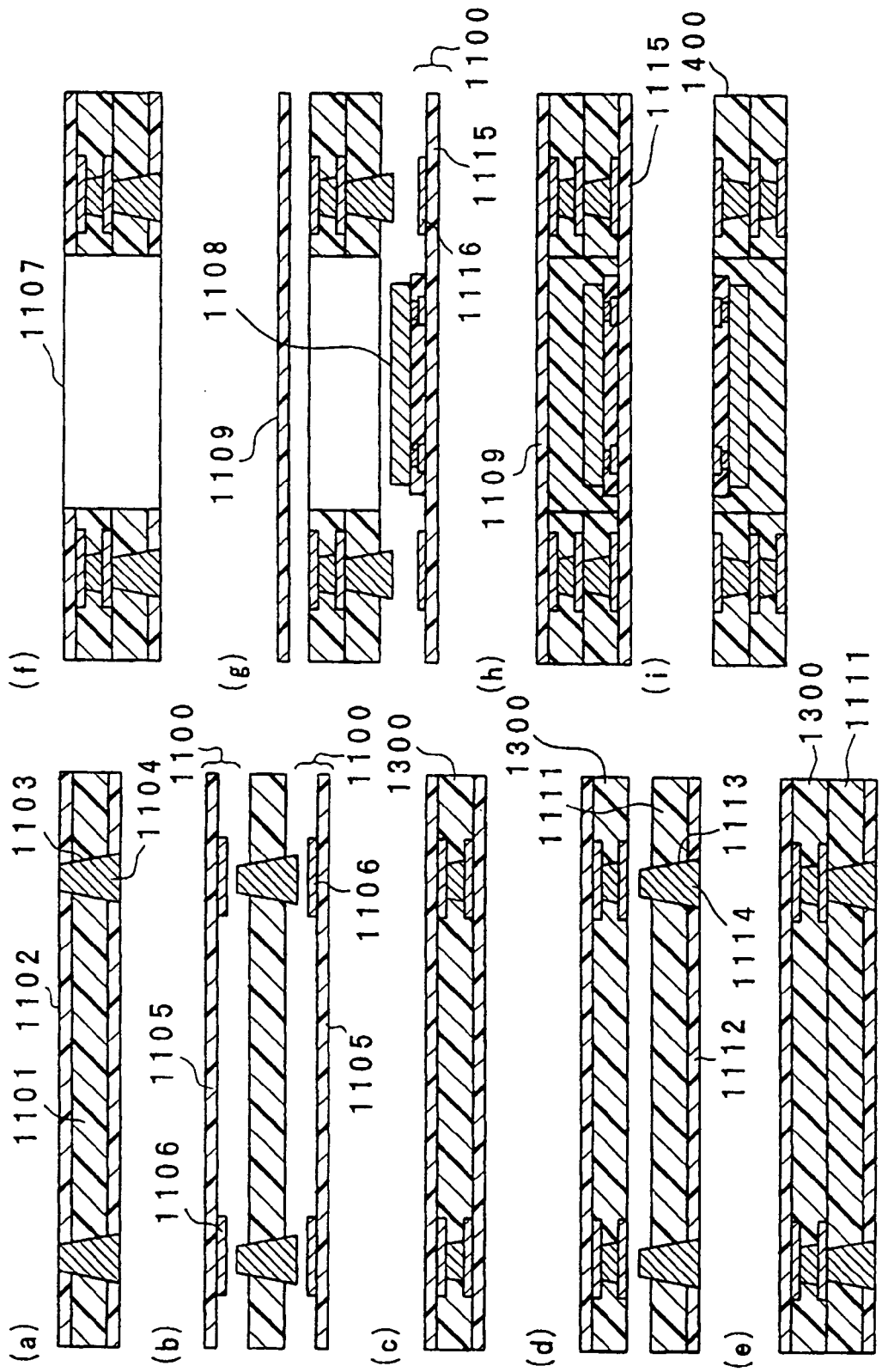
FIGS. 11(a) to 11(i) show schematic cross-sectional views illustrating the steps in an embodiment of a method for producing a wiring board with a built-in component of the present invention.

FIG. 11(*c*) shows the step of heating and pressurizing the wiring transfer sheets 1100 which are laminated on both surfaces of the electrically insulating substrate 1101. Here, heating and pressurization are carried out in such a manner that the thermosetting resin contained in the electrically insulating substrate is pre-cured and the wiring layers are temporarily adhered to the electrically insulating substrate, whereby a wiring board intermediate 1300 is obtained. Such heating and pressurization can be conducted with a simple apparatus such as a laminator. When using a vacuum laminator which has a flat plate structure, heating and pressurization are carried out under a condition of, for example, 0.98 MPa 10 kgf/cm$^2$), 80° C., and 5 minutes. It should be noted that when heating and pressurization are conducted under such conditions, the conductive paste 1104 in the electrically insulating substrate 1101 is not sufficiently compressed and the electrical connection between the wiring layers is not ensured by the conductive paste.

FIG. 11(*d*) shows the step of peeling off one of two carrier bases of the two wiring transfer sheets from the obtained intermediate wiring board 1300, and superposing an electrically insulating substrate 1111 on the exposed surface resulting from the peeling off. This electrically insulating substrate 1111 has through holes 1113 filled with a conductive paste 1114. This electrically insulating substrate 1111 corresponds to one which is obtained by carrying out the same steps as described with reference to Fig. (a) and then peeling off one of cover films. The electrically insulating substrate 1111 is disposed so that the surface exposed by peeling off is in contact with the electrically insulating substrate 1101.

FIG. 11(*e*) shows the step of heating and pressurizing the substrate 1111 which is superposed on the substrate 1101. The carrier base 1105 and the cover film 1112 which are not removed from the electrically insulating substrate 1101 and 1111 in FIG. 11(*d*), serve to protect a laminate in this step. Heating and pressurization are carried out under the same condition as that in the step of FIG. 11(*c*). This condition is convenient because the cover film does not melt even if it is a PET or PEN film, which does not withstand a high temperature (such as 200° C.). In the obtained laminate, the thermosetting resin contained in the electrically insulating substrate 1111 is pre-cured, and the electrically insulating substrate 1111 is temporarily adhered to the intermediate 1300 of wiring board.

FIG. 11(*f*) shows the step of forming a component-receiving space 1107 wherein the component is to be disposed. In the illustrated method, the component-receiving space is a through hole which penetrates the electrically insulating substrates 1101, 1111. As a method for forming the through hole, a punching process with a metallic die, a laser process and a router process may be employed. The carrier base 1105 and the cover film 1112 provided on the surfaces serve as a protective film during processing.

FIG. 11(*g*) shows the step of arranging a wiring transfer sheet 1110 with a component 1108 mounted on a surface where a wiring layer 1116 is formed, on one surface of the laminate obtained in the step of FIG. 11(*f*) so that the component is positioned in the component-receiving space 1107. Further, in this step, a protection sheet 1109 is superposed on the other surface of the laminate. In the illustrated method, a semiconductor chip is used as the component 1108, and this component is bare chip mounted, and an under fill resin is injected to seal the area between the semiconductor chip 1108 and the wiring layer 1116. The components mounted on the wiring board are not limited to this, and a chip component may be mounted. In the illustrated method, the protection sheet 1109 is the same as the carrier base 1115 of the wiring transfer sheet 1110. Thereby, both sheets 1109 and 1115 can be conveniently removed in one process.

FIG. 11(*f*) shows the step of heating and pressurizing a laminate which includes the wiring transfer sheet 1110 and the protection sheet 1109. Heating and pressurization are preferably conducted in vacuum under the condition that the resin component of the electrically insulating substrate 1111 flows and fills the component-receiving space. The condition of heating and pressurization may be a post-curing condition for the thermosetting resin, or may not be the post-curing condition for the resin as long as the condition allows the resin contained in the electrically insulating substrate to flow sufficiently. For example, when the heating and pressuring condition of 4.9 MPa (50 kgf/cm$^2$), 200° C. and one hour, which is a post-curing condition for the resin is employed, the resin is exposed to a temperature range at which its viscosity is minimum before the resin is hardened, ensuring the flow of the resin. Further, when the resin is post-cured, the conductive pastes 1104 and 1114 in the electrically insulating substrates 1101 and 1111 are also post-cured to ensure an electrical connection between the wiring layers. When both surfaces of each of the wiring layers 1106 and 1116 are rough surfaces, the adhesion between the conductive paste and the wiring layer become higher, improving the reliability of the electrical connection.

FIG. 11(*i*) shows the step of removing the protection sheet 1109 and the carrier base 1115. Wiring layers on both surfaces of the wiring board 1400 that is obtained in this step are formed with the wiring transfer sheet of the present invention, and have rough surfaces on both surfaces (that is, the surfaces of the wiring layers which are exposed after the removal of the carrier bases are also rough surfaces). Therefore, both surfaces of the wiring board 1400 are rough surfaces as a whole.

The laminate shown in FIG. 11(*i*) serves as a wiring board if the thermosetting resin in the electrically insulating substrates is post-cured in the final step of heating and pressurizing. However, in the wiring board shown in FIG. 11(*i*), no wire exists on one of the surfaces where the component receiving space 1107 has been formed (that is, the lower surface which is opposite to the component in FIG. 11(*i*)). The area where no wire exists becomes a dead space when a component is mounted on the surface of the wiring board.

Figure 12:
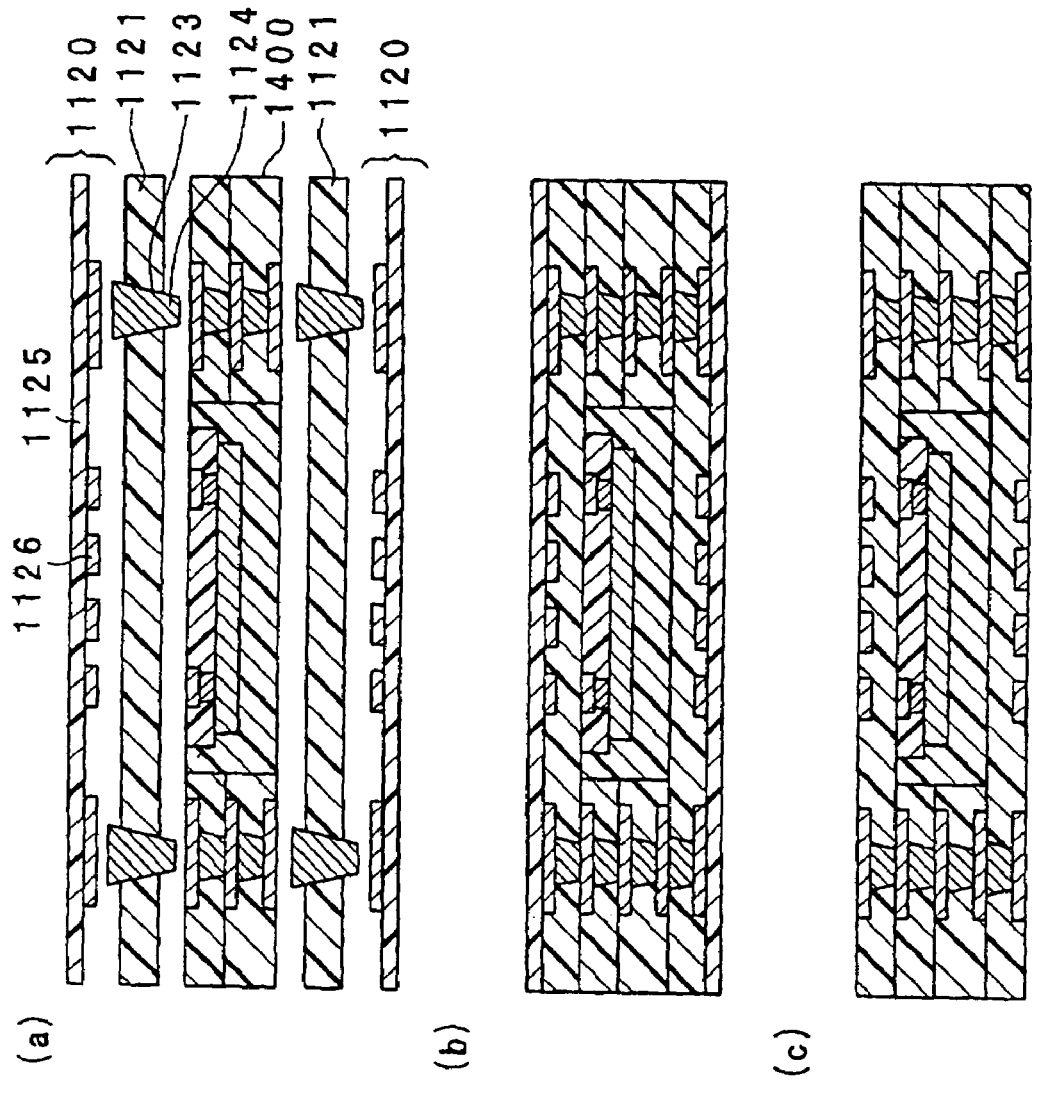
FIGS. 12(a) to 12(c) show schematic cross-sectional views illustrating the steps in an embodiment of a method for producing a wiring board with a built-in component which is a variation of the production method shown in FIG. 11.

In order to eliminate this dead space, another electrically insulating substrate and another wiring layer are further formed as shown in FIGS. 12(*a*) to 12(*c*). FIG. 12(*a*) shows the step in which two electrically insulating substrates 1121 with through holes 1123 filled with a conductive paste 1124 are prepared, and are superposed on both surfaces of the wiring board 1400 shown in FIG. 11(*i*) while wiring transfer sheets 1120 are further superposed on the surfaces of the electrically insulating substrates 1121. The wiring transfer sheet 1120 is the same as that used in the step of FIG. 11(*b*), and is comprised of a wiring layer 1126 and a carrier base 1125 whose exposed surface is a rough surface. Here, the electrically insulating substrates are superposed on both surfaces of the wiring board in order to reduce warpage which is caused by shrinkage of the electrically insulating substrate due to curing of the resin. The shrinkage due to curing of the resin is small, and the electrically insulating substrate may be disposed on only one surface of the wiring board.

FIG. 12(b) shows the step of heating and pressurizing the wiring transfer sheets 1120 and the electrically insulating substrates 1121 which are stacked. Heating and pressurization are carried out under the condition that the thermosetting resin contained in the electrically insulating substrate 1121 is post-cured. In the case where the wiring board is produced as shown in FIG. 12, it is preferable that the wiring board 1400 is obtained by carrying out heating and pressurization under the condition that the thermosetting resin is pre-cured in the step of FIG. 11(h). This is for obtaining a more favorable adhesion between the wiring board 1400 and the electrically insulating substrate 1121, and for preventing warpage in the finally obtained wiring board.

FIG. 12(c) shows the step of peeling off the carrier base 1125 of the wiring transfer sheet 1120. As a result, the wiring board wherein a dead space is eliminated is obtained, as shown in FIG. 12(c).

In the production method shown in FIG. 11, the step of FIG. 11(e) may be a step of transferring the wiring layer to the electrically insulating substrate 1111, wherein the cover film 1112 is peeled off from the electrically insulating substrate 1111. A wiring transfer sheet is superposed on the electrically insulating substrate, and then heating and pressurization are carried out. By repeating the steps shown in FIGS. 11(a) to 11(e) while carrying out the step of FIG. 11(e) as the wiring transfer step, a multilayer board which has a desired thickness depending on the size of the built-in component, can be obtained. Further, in the case where the steps shown in FIGS. 11(a) to 11(e) are repeated and both surfaces of the wiring layer are rough surfaces, the reliability of the electrical connection between the wiring layers which is made by the conductive paste is improved. Furthermore, the use of the wiring transfer sheet of the present invention makes a surface of the electrically insulating substrate a rough surface, for example a surface having numbers of fine convexities. Therefore, it is possible to ensure good adhesiveness of the electrically insulating substrate to the next electrically insulating substrate which is superposed thereon.

Figure 13:
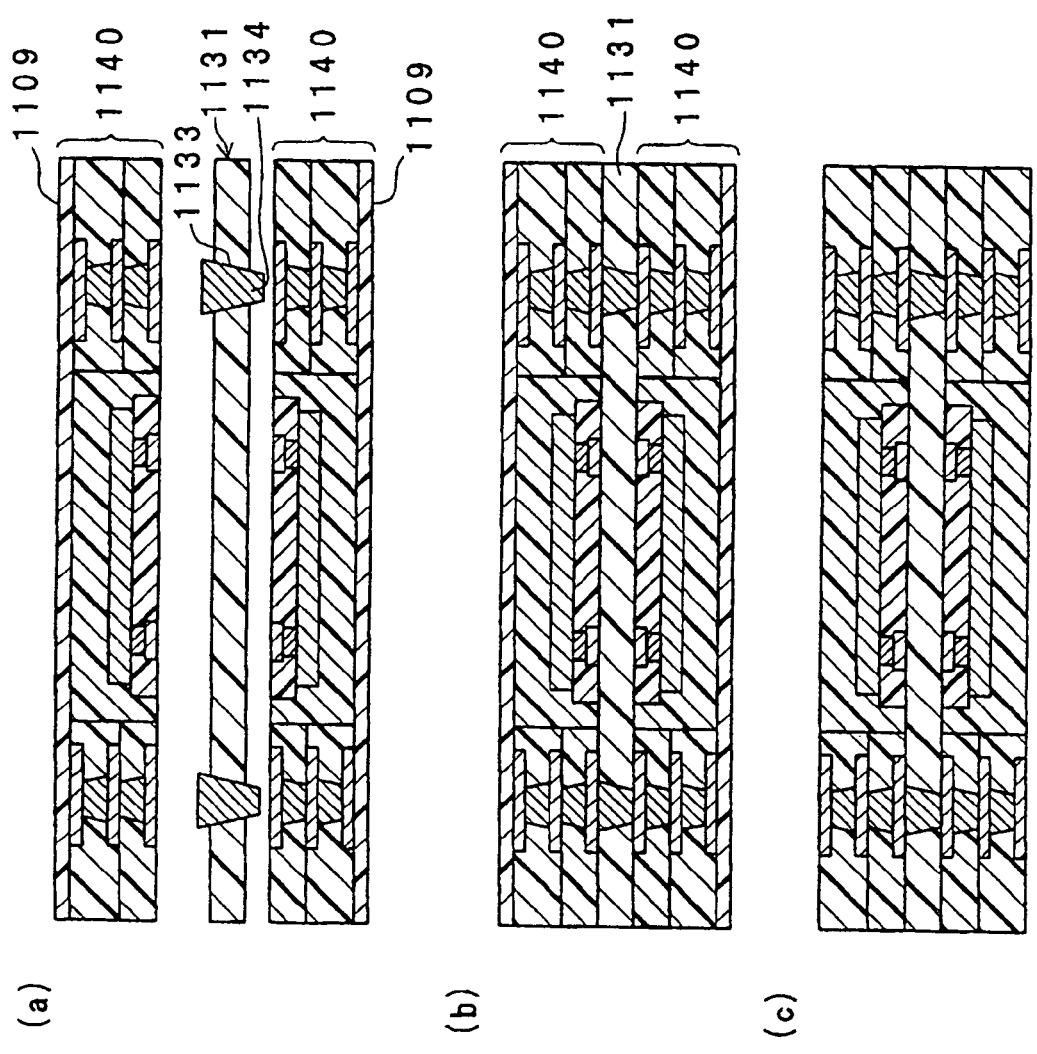
FIGS. 13(a) to 13(c) show schematic cross-sectional views illustrating the steps in another embodiment of a method for producing a wiring board with a built-in component which is a variation of the production method shown in FIG. 11.
Figure 14:
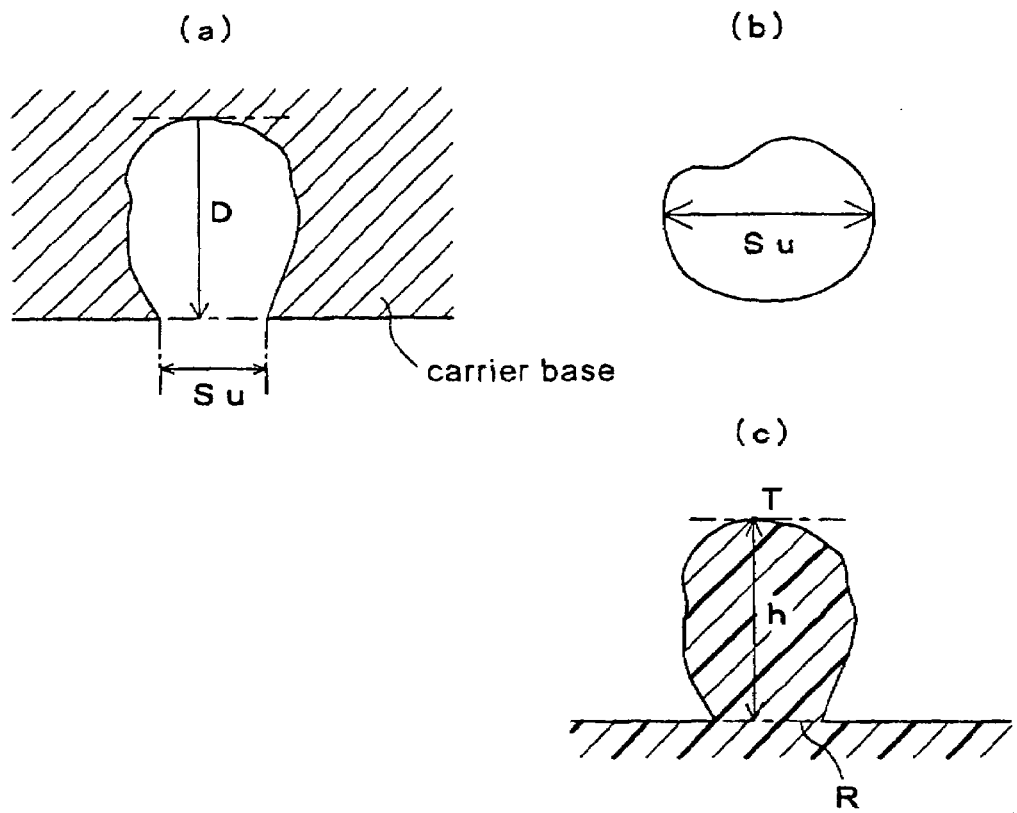
FIG. 14(a) shows a schematic cross-sectional view illustrating the depth of a concavity and a diameter on a surface of a carrier base of the concavity of a wiring transfer sheet of the present invention.
FIG. 14(b) shows a top view illustrating a diameter on a surface of a carrier base of the concavity.
FIG. 14(c) shows a schematic sectional view illustrating a convexity which is formed by the concavity shown in FIG. 14(a)

Further, FIG. 13 shows another embodiment of the method for producing a wiring board with a built-in component, which is an application of the production method shown in FIG. 11. FIG. 13(a) shows a step of preparing two structures 1140 which are obtained by peeling off the protective sheets 1109 after heating and pressurization in the step of FIG. 11(h), and then superposing these on both surfaces of an electrically insulating substrate 1131. The electrically insulating substrate 1131 has through holes 1133 filled with a conductive paste 1134.

FIG. 13(b) shows the step of heating and pressurizing the structure 1140 and the electrically insulating substrates 1131 in a state in which they are stacked. Heating and pressurization are carried out under the condition that the thermosetting resin contained in the electrically insulating substrate 1131 is post-cured.

FIG. 13(c) shows the step of peeling off the protective sheet 1109. As shown, in the obtained wiring board, two built-in components are stacked. The components may be different from each other. Further, in order to eliminate the dead space in the wiring board shown in FIG. 13(c), another electrically insulating substrate and another wiring layer are further superposed by carrying out the steps shown in FIG. 12.

Even when any of the production methods is employed, at least an exposed area of a surface of an electrically insulating substrate to which the wiring layer is transferred, is made a rough surface (for example, a rough surface with fine convexities) by forming a wiring layer using a wiring transfer sheet of the present invention. The fine convexities provide an anchoring effect when an electrically insulating substrate is laminated thereon. Therefore, by using the wiring transfer sheet of the present invention, a multilayer wiring board with a built-in component is obtained so that a good adhesion between the electrically insulating substrates is ensured.

Alternatively, in FIG. 11(d), in place of the double-faced wiring board, a laminate as shown in FIG. 9(f) may be superposed on an electrically insulating substrate 1111, and then the steps shown in FIGS. 11(f) to 11(i) may be conducted in order. In that case, the carrier base 901 shown in FIG. 9(f) serves to protect the laminate in the step of FIG. 11(e). Alternatively, a wiring board with a built-in component can be produced by forming a space for receiving the component in the laminate shown in FIG. 9(f), followed by superposing this laminate on the wiring transfer sheet with a mounted component and integrating them.

Each of the methods for producing a wiring board as described above with reference to FIGS. 8 to 13 is merely an embodiment of the production method of the present invention, and there are many other variations. For example, in each production method, an electrically insulating substrate containing a thermoplastic resin may be used in place of the electrically insulating substrate containing an uncured thermosetting resin. For example, in FIG. 11, if such an electrically insulating substrate is used, the thermoplastic resin is softened and flows upon transferring the wiring layer of the wiring transfer sheet with a mounted component, by heating and pressurization, so that the exposed surface of the electrically insulating substrate is made a rough surface and the void around the component is filled. Further, in the case where superposing an electrically insulating substrate and transferring a wiring layer are repeated, all the electrically insulating substrates do not necessarily need to be made from the same material. For example, after a wiring layer has been transferred to an electrically insulating substrate containing a thermoplastic resin, an electrically insulating substrate containing a thermosetting resin may be superposed on it.

What is claimed is:

1. A method of producing a wiring transfer sheet comprising a carrier base and a wiring layer formed on a surface of the carrier base, the method comprising:

pressing a sheet of wiring material having a first rough surface against a surface of the carrier base such that:
the first rough surface is in contact with the surface of the carrier base during said pressing;
the sheet of wiring material is positioned on the surface of the carrier base by said pressing so as to be capable of being separated from the surface of the carrier base; and
the surface of the carrier base is formed into a second rough surface complementary to the first rough surface of the sheet of wiring material due to pressure from the first rough surface against the surface of the carrier base;

forming a wiring layer with a predetermined wiring nattern on the surface of the carrier base by etching the sheet of wiring material; and subjecting the surface of the carrier base to a releasing treatment before said pressing of the sheet of wiring material against the surface of the carrier base.

2. The method according to claim 1, wherein the first rough surface is a surface having a plurality of convexities.

3. The method according to claim 1, wherein said releasing treatment comprises coating a silicone resin on the surface of the carrier base.

4. The method according to claim 3, wherein said coating of the silicone resin comprising coating the silicone resin on the surface of the carrier base to a thickness of between 0.01 μm and 1.0 μm.

5. The method according to claim 1, further comprising forming the first rough surface by depositing metal particles on a surface of the sheet of wiring material to form convexities.

6. The method according to claim 5, wherein said depositing the metal particles is performed by electrolytic plating.

* * * * *

UNITED STATES PATENT AND TRADEMARK OFFICE
CERTIFICATE OF CORRECTION

PATENT NO. : 7,200,927 B2 Page 1 of 1
APPLICATION NO. : 10/758129
DATED : April 10, 2007
INVENTOR(S) : Hideki Higashitani It is certified that error appears in the above-identified patent and that said Letters Patent is hereby corrected as shown below:

In column 44, line 62, claim 1, replace "nattem on" with --pattern on--.

Signed and Sealed this

Fourth Day of September, 2007

JON W. DUDAS
*Director of the United States Patent and Trademark Office*